US010672898B2

(12) United States Patent
Muir

(10) Patent No.: US 10,672,898 B2
(45) Date of Patent: Jun. 2, 2020

(54) AMORPHOUS METAL HOT ELECTRON TRANSISTOR

(71) Applicant: Amorphyx, Incorporated, Corvallis, OR (US)

(72) Inventor: Sean William Muir, Corvallis, OR (US)

(73) Assignee: Amorphyx, Incorporated, Corvallis, OR (US)

( * ) Notice: Subject to any disclaimer, the term of this patent is extended or adjusted under 35 U.S.C. 154(b) by 0 days.

(21) Appl. No.: 16/309,804

(22) PCT Filed: Jul. 7, 2017

(86) PCT No.: PCT/US2017/041252
§ 371 (c)(1),
(2) Date: Dec. 13, 2018

(87) PCT Pub. No.: WO2018/009901
PCT Pub. Date: Jan. 11, 2018

(65) Prior Publication Data
US 2019/0318926 A1    Oct. 17, 2019

Related U.S. Application Data

(60) Provisional application No. 62/359,596, filed on Jul. 7, 2016.

(51) Int. Cl.
*H01L 29/76*    (2006.01)
*G02F 1/1343*    (2006.01)
(Continued)

(52) U.S. Cl.
CPC ...... *H01L 29/7606* (2013.01); *G02F 1/13439* (2013.01); *H01L 21/76832* (2013.01);
(Continued)

(58) Field of Classification Search
CPC .......... H01L 29/66931; H01L 29/7606; H01L 21/02592; H01L 21/32055;
(Continued)

(56) References Cited

U.S. PATENT DOCUMENTS

| 8,035,169 B2 | 10/2011 | Ishida et al. |
| 8,378,937 B2 | 2/2013 | Iba et al. |

(Continued)

FOREIGN PATENT DOCUMENTS

| JP | 2001-265255 A | 9/2001 |
| JP | 2010-123338 A | 6/2010 |

(Continued)

OTHER PUBLICATIONS

Den Boer, "6.2: A Select Line Driver for the Offset-Scan-and-Hold Dual Select Diode AMLCDs," *Society for Information Display Symposium Digest of Technical Papers* 32(1):44-47, 2001.

(Continued)

*Primary Examiner* — Scott B Geyer
(74) *Attorney, Agent, or Firm* — Seed IP Law Group LLP

(57) ABSTRACT

Amorphous multi-component metallic films can be used to improve the performance of electronic devices such as resistors, diodes, and thin film transistors. An amorphous hot electron transistor (HET) having co-planar emitter and base electrodes provides electrical properties and performance advantages over existing vertical HET structures. Emitter and the base terminals of the transistor are both formed in an upper crystalline metal layer of an amorphous nonlinear resistor. The emitter and the base are adjacent to one another and spaced apart by a gap. The presence of the gap results in two-way Fowler-Nordheim tunneling between the crystalline metal layer and the amorphous metal layer, and symmetric I-V performance. Meanwhile, forming the emitter and base terminals in the same layer simplifies the HET (Continued)

fabrication process by reducing the number of patterning steps.

21 Claims, 17 Drawing Sheets

(51) Int. Cl.
| | |
|---|---|
| *H01L 21/768* | (2006.01) |
| *H01L 27/12* | (2006.01) |
| *H01L 29/04* | (2006.01) |
| *H01L 29/49* | (2006.01) |
| *H01L 45/00* | (2006.01) |
| *H01L 49/02* | (2006.01) |
| *H01L 29/66* | (2006.01) |

(52) U.S. Cl.
CPC ...... *H01L 21/76838* (2013.01); *H01L 27/124* (2013.01); *H01L 29/04* (2013.01); *H01L 29/4908* (2013.01); *H01L 29/66931* (2013.01); *H01L 45/00* (2013.01); *H01L 49/02* (2013.01)

(58) Field of Classification Search
CPC ......... H01L 21/76832; H01L 21/76838; H01L 27/124; H01L 29/04; H01L 29/4908
See application file for complete search history.

(56) References Cited

U.S. PATENT DOCUMENTS

| | | |
|---|---|---|
| 8,436,337 B2 | 5/2013 | Cowell, III et al. |
| 8,822,978 B2 | 9/2014 | Cowell, III et al. |
| 9,099,230 B2 | 8/2015 | Cowell, III |
| 2003/0161181 A1 | 8/2003 | Saito et al. |
| 2006/0012000 A1 | 1/2006 | Estes et al. |
| 2006/0028591 A1 | 2/2006 | Kim |
| 2009/0015151 A1 | 1/2009 | Ishihara et al. |
| 2010/0298005 A1 | 11/2010 | Yavuz et al. |
| 2014/0048797 A1 | 2/2014 | Yu et al. |
| 2014/0302310 A1 | 10/2014 | Cowell, III et al. |
| 2015/0055047 A1 | 2/2015 | Chang et al. |
| 2015/0115260 A1 | 4/2015 | Shieh et al. |
| 2018/0203309 A1 | 7/2018 | Cowell, III et al. |
| 2018/0308744 A1 | 10/2018 | Muir |

FOREIGN PATENT DOCUMENTS

| | | |
|---|---|---|
| JP | 2009-130167 A | 6/2019 |
| WO | 2017/066332 A1 | 4/2017 |

OTHER PUBLICATIONS

Grubbs et al., "Development and characterization of high temperature stable Ta—W—Si—C amorphous metal gates," *Applied Physics Letters* 97(22):223505, 2010. (3 pages).

Heiblum et al., "Ballistic hot-electron transistors," *IBM Journal of Research and Development* 34(4):530-549, Jul. 1990.

Heiblum, "Tunneling Hot Electron Transfer Amplifiers (Theta): Amplifiers Operating up to the Infrared," *Solid-State Electronics* 24(4):343-366, 1981.

Matsukawa et al., "Suppressing $V_t$ and $G_m$ Variability of FinFETs Using Amorphous Metal Gates for 14 nm and Beyond," *International Electron Devices Meeting*, San Francisco, California, USA, Dec. 10-13, 2012, pp. 8.2.1-8.2.4.

Mead, "Operation of Tunnel-Emission Devices," *Journal of Applied Physics* 32(4):646-652, Apr. 1961.

Nelson et al., "Hot-Electron Transfer through Thin-Film Al—$Al_{2O3}$ Triodes," *Journal of Applied Physics* 37(1):66-76, Jan. 1966.

Ohmori et al., "Impact of Additional Factors in Threshold Voltage Variability of Metal/High-k Gate Stacks and Its Reduction by Controlling Crystalline Structure and Grain Size in the Metal Gates," *International Electron Devices Meeting*, San Francisco, California, USA, Dec. 15-17, 2008, pp. 1-4.

Torres, Jr. et al., "High-Current Gain Two-Dimensional $MoS_2$Base Hot-Electron Transistors," *Nano Letters* 15(12):7905-7912, 2015.

Vaziri et al., "A Graphene-Based Hot Electron Transistor," *Nano Letters* 13(4):1435-1439, 2013.

Vaziri et al., "Going ballistic: Graphene hot electron transistors," *Solid State Communications* 224:64-75, 2015.

Zeng et al., "Vertical Graphene-Base Hot-Electron Transistor," *Nano Letters* 13(6):2370-2375, 2013.

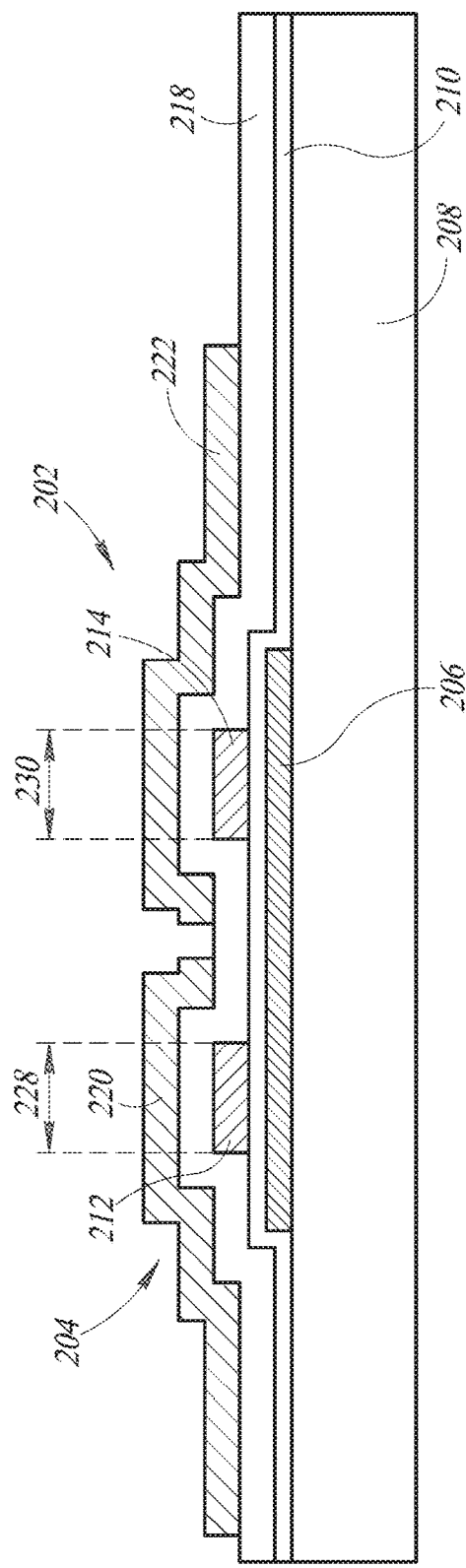
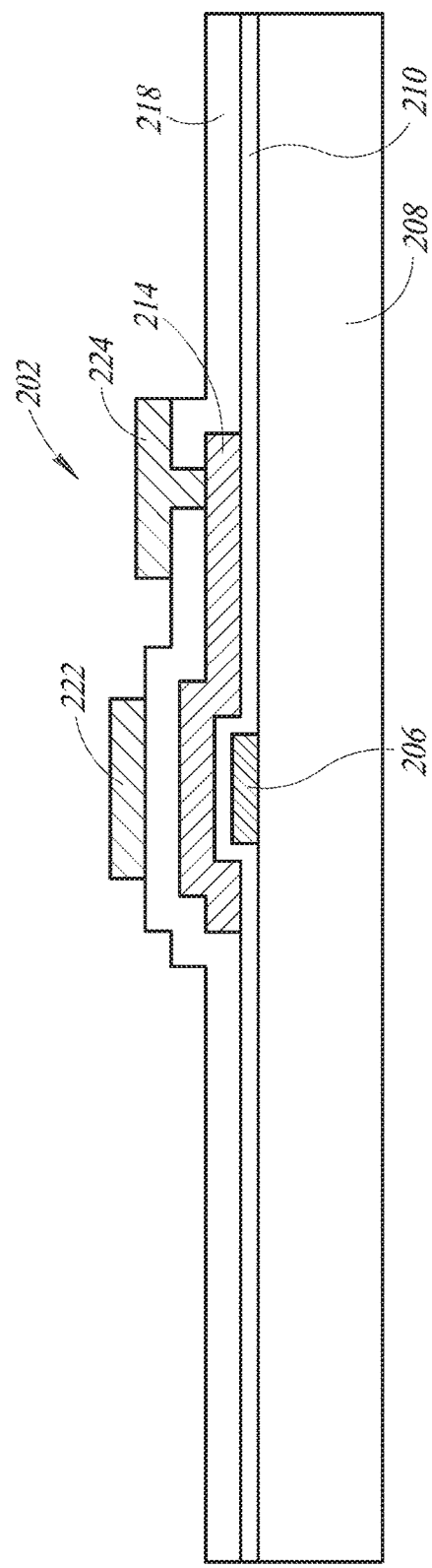
FIG. 2B
FIG. 2C

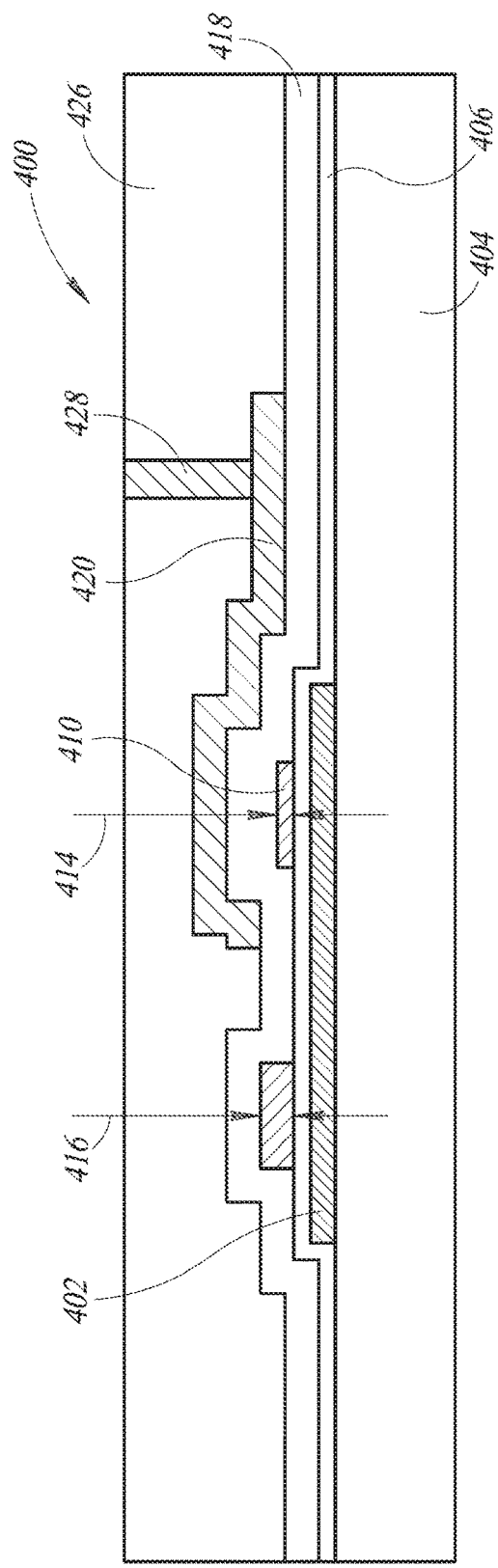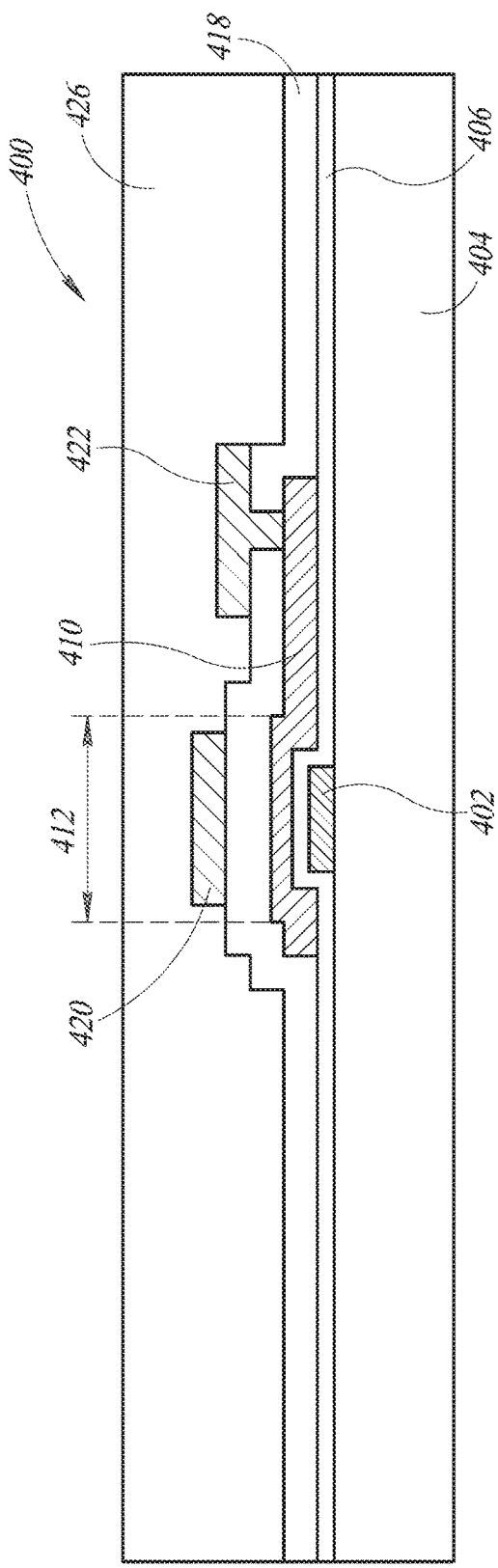
FIG. 4B
FIG. 4C

AMORPHOUS METAL HOT ELECTRON TRANSISTOR

BACKGROUND

Technical Field

The present disclosure relates to microelectronic devices that include three terminal devices having one or more layers of an amorphous metal film.

Description of the Related Art

Amorphous metals are rigid solid materials whose atomic structure lacks long-range periodicity that characterizes crystalline materials. In an amorphous metal, formation of crystalline planes is suppressed, for example, by incorporating two or more components. An example of an amorphous metal having four components—zirconium, copper, aluminum, and nickel—is $Zr_{55}Cu_{30}Al_{10}Ni_5$, as described in U.S. Pat. No. 8,436,337. Amorphous metals can be identified by their resistivity measurements, which have shown that an amorphous metal material, while still conductive, has about ten times greater resistivity than its crystalline counterpart. Amorphous metals also have smoother surfaces than crystalline metals, as indicated by root mean square (RMS) surface roughness measurements.

Amorphous multi-component metallic films (AMMFs), in the range of about 10-200 nm thick, can be used to improve the performance of electronic components such as resistors, diodes, and thin film transistors. Many deposition techniques that are well known in the art can be used to form AMMFs. For example, the exemplary amorphous metal noted above, $Zr_{55}Cu_{30}Al_{10}Ni_5$, is an AMMF and can be formed on a substrate by conventional sputter deposition using four different metal targets. It is understood by those skilled in the art of thin films that the interfacial properties of AMMFs are superior to those of crystalline metal films, and therefore electric fields at the interface of an AMMF and an oxide film are more uniform.

For example, such uniformity has produced superior current-voltage (I-V) characteristic curves for metal-insulator-metal (MIM) diodes and transistors that exhibit Fowler-Nordheim tunneling. The tunneling MIM diodes incorporate an AMMF as a lower electrode, and a crystalline metal film as an upper electrode. The two different electrodes are separated by a single dielectric barrier that provides a tunneling pathway for charge carriers to move between the electrodes. The presence of the single dielectric barrier results in a current response that depends on the polarity of the applied voltage. Such a current response can be referred to as one-way tunneling because at a specific voltage the charge carriers in the device are only tunneling in one direction. That is, tunneling occurs either from the lower electrode to the upper electrode, or from the upper electrode to the lower electrode, according to the polarity of the applied voltage. Various diode and transistor applications of AMMFs are discussed in U.S. Pat. Nos. 8,436,337 and 8,822,978.

Amorphous metal thin film non-linear resistors (AMNRs), having superior performance to existing thin film non-linear resistors, are discussed in U.S. Pat. No. 9,099,230 and PCT Patent Application No. WO2014/074360. Such AMNRs are of interest, in part, because their current response is independent of the polarity of the applied voltage, which is not true for other thin film resistors. This polarity independence is due to the presence of two dielectric barriers, wherein the charge carriers at each barrier are forced to tunnel in substantially opposite directions. AMNRs can be described as exhibiting two-way tunneling because, in response to an applied voltage, the charge carriers in the device tunnel in both directions across the barriers. That is, tunneling occurs from the upper electrode to the lower electrode and from the lower electrode to the upper electrode, regardless of the polarity of the applied voltage. Such polarity-symmetric AMNRs may provide improved signal control in liquid crystal display (LCD) or organic light emitting diode (OLED) display technologies and electromagnetic sensor arrays.

BRIEF SUMMARY

The present disclosure is directed to active electronics formed on a support substrate that is not necessarily a semiconductor substrate.

An AMNR can be constructed as a three-layer structure, similar to the AMMF diode described above, in which an amorphous metal layer is formed on a substrate; a tunneling insulator, e.g., an oxide layer, is formed over the amorphous metal layer; and a crystalline metal layer is formed on top of the oxide. However, in the case of the AMNR resistor as opposed to a MIM diode, both the amorphous and crystalline metal layers are patterned into finger-shaped electrodes that overlap one another only in selected areas, which are active areas. When a voltage is applied between two top metal fingers, a tunneling current flows from the top metal layer, through the underlying amorphous metal layer, and back up to the top metal layer. By modifying the patterns of the metal electrodes relative to one another, additional active areas can be created, and tunneling from the top metal layer down to the amorphous metal layer and then back up to the top metal layer can be forced to occur more than once. Alternatively, by modifying the patterns of the metal electrodes relative to one another, the shape and size of the overlapping areas can be modified. Each of these modifications allows the I-V performance characteristics of an AMNR resistor to be adjusted without modifying the tunneling dielectric.

HET structures include two substructures. An emitter-base substructure is formed by the emitter electrode, tunnel dielectric, and base electrode. A base-collector substructure is formed by the base electrode, collector dielectric, and collector electrode. The emitter-base substructure is responsible for generating the hot electrons via tunneling. The base-collector substructure collects the generated hot electrons at the collector electrode. Hot electron generation and collection can each be controlled independently by voltages applied to their respective electrodes. Existing vertical HET structures that incorporate amorphous metals use the amorphous metal layer directly as an emitter electrode, which is stacked vertically in line with the base and collector electrodes, separated by their respective dielectrics. This forms an emitter-base substructure that acts as an amorphous metal MIM and has an asymmetric current voltage response due to one-way tunneling. This type of vertical HET is disclosed in U.S. Pat. No. 8,436,337.

In an embodiment of the present disclosure, an amorphous hot electron transistor (HET) having co-planar emitter and base electrodes provides electrical properties and performance advantages over existing vertical HET structures. According to one embodiment of a HET structure, the emitter and the base terminals of the transistor are both formed in an upper layer of an AMNR. The emitter and the base are adjacent to one another and spaced apart by a gap. The presence of the gap ensures that two-way Fowler-Nordheim tunneling will occur between the upper crystalline metal layer and the lower amorphous metal layer. The HET further includes a collector dielectric layer and a collector electrode formed on the dielectric layer. Front side contacts can be made by forming vias through the collector dielectric layer to the emitter and base terminals.

During operation of the amorphous metal HET emitter-base substructure, electrons flow downward from the crystalline metal layer to the amorphous metal layer, across the amorphous metal layer, which serves as a transport layer, and then back up to the crystalline metal layer. Such a U-shaped current path produces, for a transistor, a symmetric current-voltage (I-V) characteristic for the base-emitter substructure that is similar to the symmetric I-V performance that characterizes existing AMNR diodes. In other words, an advantage that is afforded by such symmetry is now extended from a two terminal device to a three terminal device. Furthermore, by modifying the patterns of the amorphous metal transport layer, the emitter, and the base electrodes, the I-V performance characteristics of an emitter-base substructure can be adjusted without modifying the tunneling dielectric. This strategy has additional advantages for HET devices over AMNR devices in that Fowler-Nordheim tunneling must be maintained to generate hot electrons, but is sensitive to dielectric thickness and material changes.

According to an embodiment of the present disclosure, performance of the HET device can be tuned by sizing the base and emitter electrodes. The widths and depths of the base and emitter electrodes are each desirably in the range of about 5-100 μm. The gap between the co-planar base and emitter electrodes is desirably in the range of about 1-5 μm. The collector electrode width and depth dimensions are also desirably in the range of 5-100 μm. The amorphous metal thickness for the HET device is desirably in the range of 10-100 nm. The thickness of the tunneling dielectric for the HET device is desirably in the range of 4-15 nm. The base and emitter electrode thicknesses for the HET device are each in the range of 10-30 nm. In other embodiments, the thickness of the base and emitter electrode may be as thin as a single layer or a few layers of crystalline conductors. For example, one or more of the electrodes may be a 2D conductor, such as $MoS_2$, that is a monolayer. Such monolayers may be in the range of 0.6-0.8 nm. The collector dielectric layer on top of the HET has a thickness desirably in the range of about 10-50 nm.

Forming the emitter and the base in the same layer simplifies the fabrication process by reducing the number of lithography and etching steps required, compared with previous HET designs. In particular, the simplified process is suitable for integration into existing manufacturing processes used for LCD and OLED displays.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

FIGS. 2A-2C are top and cross-sectional views of an alternative embodiment of an amorphous metal thin film transistor structure according to one embodiment of the present disclosure;

FIGS. 4A-4C are top and cross-sectional views of an amorphous metal thin film transistor structure according to another embodiment of the present disclosure;

DETAILED DESCRIPTION

Figure 1A:
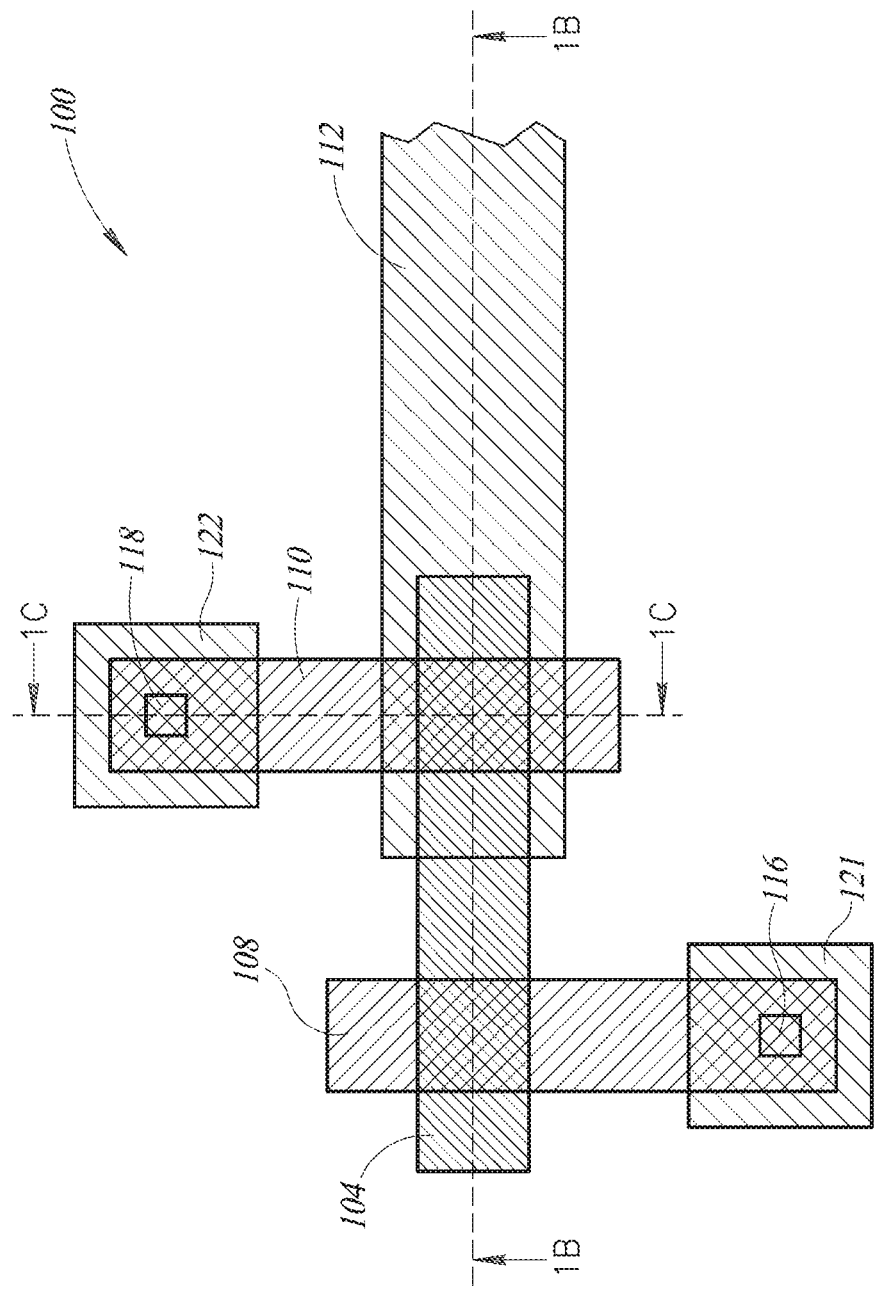
FIGS. 1A-1C are top and cross-sectional views of an amorphous metal thin film transistor structure according to one embodiment of the present disclosure.

It will be appreciated that, although specific embodiments of the present disclosure are described herein for purposes of illustration, various modifications may be made without departing from the spirit and scope of the present disclosure.

In this description, certain specific details are set forth in order to provide a thorough understanding of various aspects of the disclosed subject matter. However, the disclosed subject matter may be practiced without these specific details. In some instances, well-known structures and methods of integrated circuit processing comprising embodiments of the subject matter disclosed herein have not been described in detail to avoid obscuring the descriptions of other aspects of the present disclosure.

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

The present disclosure is directed to various implementations of a three terminal electronic device that can function as a transistor that uses amorphous metal thin films. Amorphous metal thin films, used in conjunction with a tunneling insulating layer create transistor functions without the complexity of standard, silicon based transistors. Such amorphous metal hot electron transistors can be formed on any number of support substrates, giving flexibility to designers with regard to the types of materials and products that can incorporate transistors, i.e., active circuitry.

Many aspects of our lives are benefited by utilizing ever smaller electronic devices that are built on semiconductor substrates. These include televisions, mobile electronic devices, like cellular phones, smart phones, tablet computers, and wearable electronics, like smart watches and pedometers. The transistors built on semiconductor substrates are limited by the materials used to form these circuits, i.e., silicon or other semiconductor wafers. The same amazing applications can be further expanded and improved by using new types of support substrates, such as flexible polymers. The potential applications are endless.

These transistor structures can be incorporated in displays to make them lighter and faster. As these will be very light, these may be wearable displays, integrated into internet-of-things applications, or be integrated in to medical devices. These transistor structures can be used to form high-performance analog devices or digital devices as the end application dictates.

The amorphous metal hot electron transistors described in this disclosure open up the doors to countless applications of non-semiconductor based transistors. As will be described in this disclosure, semiconductor materials can be utilized, however the transistor structures themselves are not based on doping a silicon wafer and instead incorporate forming amorphous metal thin films on any number of support substrates.

Figure 1B:
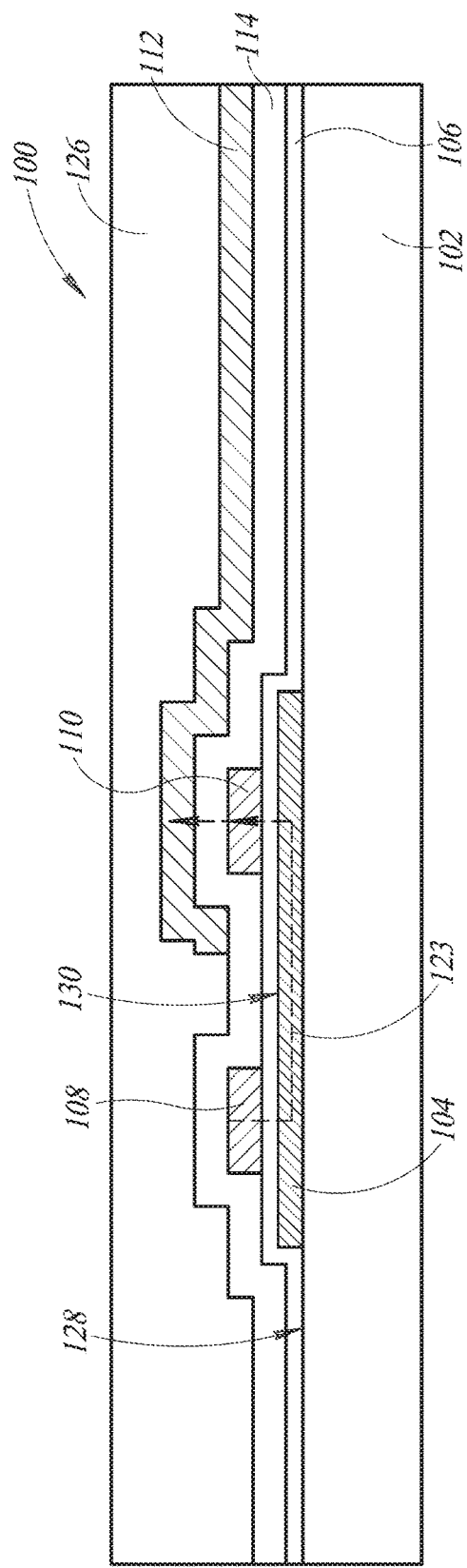
Figure 1C:
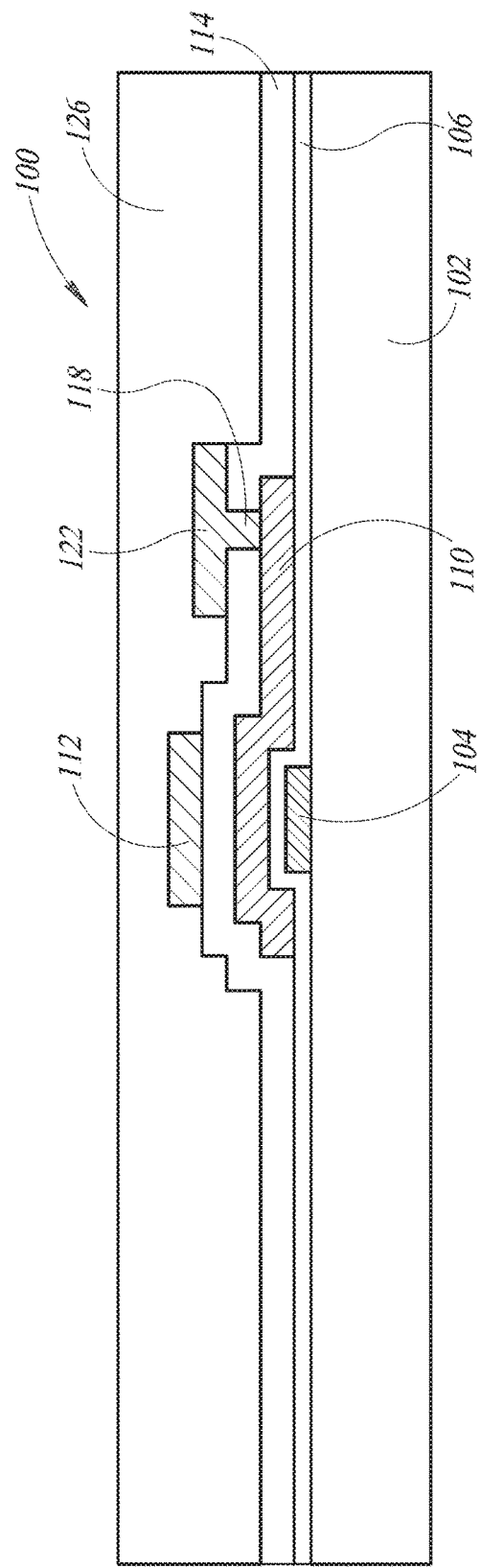

For example, a first embodiment of an amorphous metal hot electron transistor is described with respect to FIGS. 1A-1C, which are top and cross-sectional views of an amorphous metal thin film transistor structure 100 formed on a support substrate 102. The structure 100 includes an amorphous metal interconnect 104 on the support substrate 102 and a first tunneling insulator 106 on the amorphous metal interconnect 104. A first electrode 108 and a second electrode 110 are on the first tunneling insulator 106. The first and second electrodes 108, 110 overlap the amorphous metal interconnect 104. A third electrode 112 overlaps the second electrode 110 and is separated from the second electrode by a second insulator 114.

This structure includes a first terminal 121 coupled to the first electrode 108. A second terminal 122 is coupled to the second electrode 110. A third terminal (not shown) may be included to couple the third electrode 112 to another electronic device. The first and second terminals 121, 122 can be formed at the same time as the third electrode. Alternatively, the first and second terminals are formed in a subsequent processing step as forming the third electrode.

This amorphous metal thin film transistor structure 100 operates like a transistor by adjusting an electric field applied to the first electrode 108, the second electrode 110, and the third electrode 112. The first electrode 108 can be an emitter electrode, the second electrode 110 can be a base electrode, and the third electrode 112 can be a collector electrode. The transistor structure 100 can be operated in common-emitter mode, common-base mode, or common collector mode. See FIGS. 8, 9, and 10 below.

Electrons tunnel from the first electrode 108, the emitter electrode, through the first tunneling insulator 106 to the amorphous metal interconnect 104 in response to an applied voltage through the first terminal 121. The electrons travel through the amorphous metal interconnect 104 and the first tunneling insulator 106 to the second electrode, the base electrode. These electrons are considered "hot" when the tunneling has finished because their energy is above the Fermi energy of the second electrode 110, the base electrode.

By adjusting an electric field across the second insulator 114, fewer or greater numbers of these "hot" electrons can be collected at the third electrode 112, thus allowing the flow of current through the transistor structure 100, see the dashed line 123.

Unlike typical transistor structures, the amorphous metal transistor structures can be operated in a reverse mode, such that the electrons move from the third electrode 112 to the first electrode 108 via the second electrode 110 and the amorphous metal interconnect 104. In this reverse mode, the transistor structure 100 functions like a tunneling diode with an adjustable threshold voltage and asymmetry. The adjustable threshold voltage and asymmetry are achieved by modulating the electric field applied to the second electrode 110 in combination with the electric field applied from the first electrode 108 and the third electrode 112.

Figure 1D:
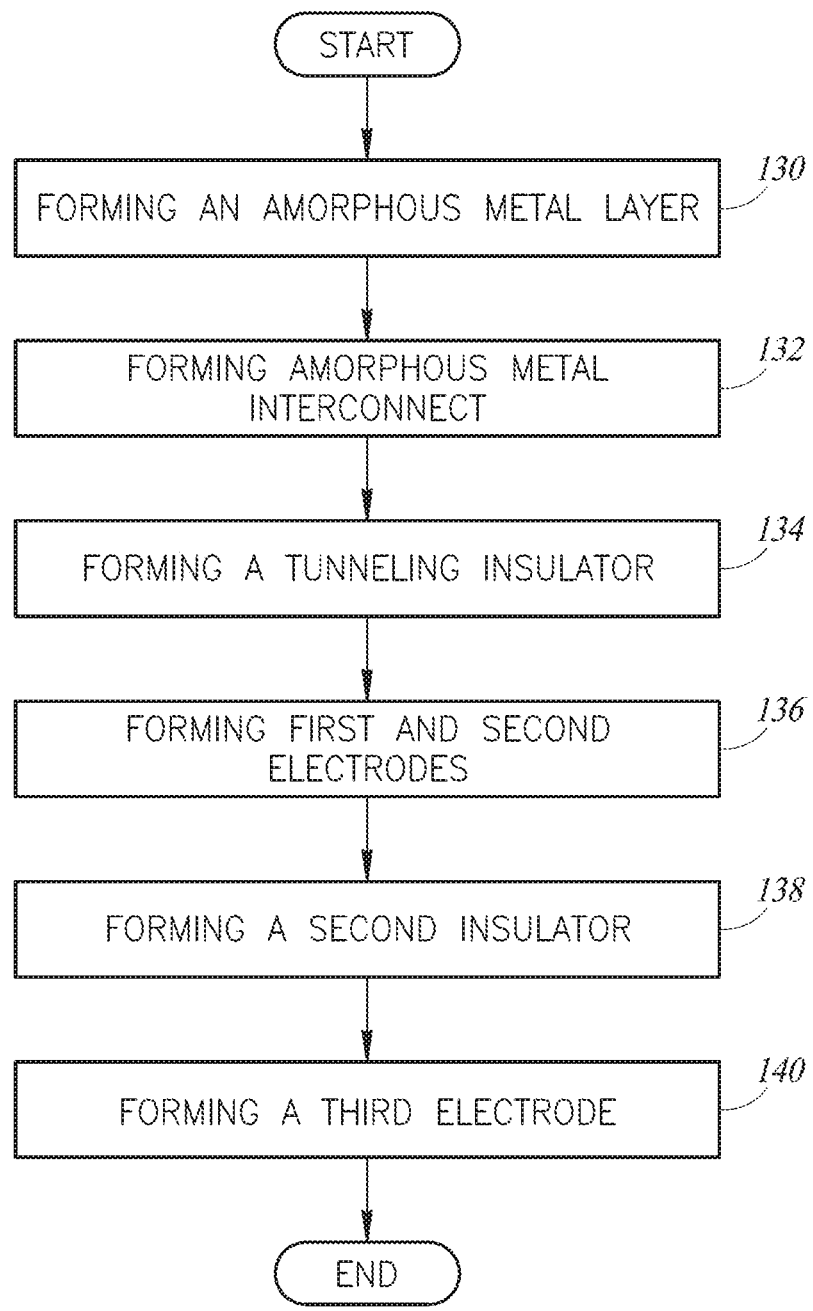
FIG. 1D is a method of forming the amorphous metal thin film transistor structure of FIGS. 1A-1C.

FIG. 1D is a method of forming the amorphous metal thin film transistor structure of FIGS. 1A-1C. The method includes forming an amorphous metal layer on a first surface 128 of the support substrate 102 at step 130. The amorphous metal layer can be formed by any suitable amorphous metal. Examples of types of amorphous metals are described in U.S. Pat. Nos. 8,436,337, 8,822,978, 9,099,230 and PCT Patent Application No. WO2014/074360.

The support substrate 102 can be any one of a variety of materials, such as a glass substrate, a plastic substrate, silicon or other semiconductor substrate, or a flexible substrate. The support substrate can be a non-conducting substrate, which is more cost effective than silicon or semiconducting substrates. For example, the support substrate could be aluminum borosilicate glass, fused silica, or other suitable non-conducting materials. If the substrate is conductive, an insulator may be formed on the top surface of the substrate between the top surface and the first electronic component formed on the substrate. For example, if a silicon or semiconductor substrate is used a native oxide or other insulator is formed on the surface of the substrate to isolate from the silicon, to ensure non-conductivity.

The materials of the support substrate 102 can be selected by the manufacturer based on the end application of the transistor structure. For example, if the transistor structure is incorporated with an array of transistor structures, the array could be implemented within a liquid crystal display. Other end applications include wearable electronics. The support substrate 102 can be transparent or non-transparent, such as those that can be used in some reflective displays.

Manufacturing on non-conducting flexible support substrates can reduce manufacturing costs significantly. Such substrates can enable roll-to-roll manufacturing of transistors. Such manufacturing changes can redefine the electronic supply chain.

After forming the amorphous metal layer, the method includes forming the amorphous metal interconnect 104 at step 132. This includes removing excess portions of the amorphous metal layer. The surface 128 is a planar surface onto which the amorphous metal layer is formed. This planar surface in conjunction with the homogenously smooth surfaces of amorphous metal layers, allow the amorphous metal interconnect 104 to have a surface 130 that is homogenously smooth, which results in fewer surface imperfections. This is in comparison to crystalline metals. Surface imperfections in crystalline metals cause inhomogeneity in the electric field, which can lead to failure of the electronic device.

The forming of the amorphous metal layer may include any film-forming technique such as sputtering, solution deposition, or electron-beamed deposition. For example, multi-source RF (or DC) magnetron sputtering using elemental or mixed composition metal targets of Zr, Cu, Ni, and Al may be employed. Sputter deposition affords a distinct manufacturing advantage over similarly smooth semiconductors deposited using advanced epitaxial technologies such as molecular beam epitaxy (MBE) or metal-organic chemical vapor deposition (MOCVD).

As described above, portions of the amorphous metal layer are etched or otherwise removed. In other embodiments, the amorphous metal layer may not be etched and instead deposited in the shape suitable for the application. The amorphous metal layer can be deposited at room temperature via sputtering and can maintain the amorphous and smooth properties in subsequent heating steps.

At 134, the method includes forming the first tunneling insulator 106 on the amorphous metal interconnect 104. The first tunneling insulator can be a very thin layer, such as a 10 nanometer or less aluminum oxide deposited by atomic layer deposition. Other alternatives are available, such as any metal oxide or nitride that can be formed to be very thin. The first tunneling insulator 106 is sufficiently thin to enable tunneling and the generation of hot electrons. The tunneling insulator can be any suitable insulator, including an oxide, a nitride, silicon nitride, metal oxides, etc.

In this method, the first tunneling insulator 106 is formed as a conformal layer in a blanket deposition. This is the simplest, most cost effective manufacturing option, however, the first tunneling insulator 106 may be patterned as suitable for the end application of the transistor structure.

At 136, the method includes forming the first electrode 108 and the second electrode 110 on the first tunneling insulator 106. These are the emitter and base electrodes. Each of the first and second electrodes overlaps the amorphous metal interconnect 104. In the top down view of FIG. 1A, the first and second electrodes are transverse or perpendicularly arranged with respect to the amorphous metal interconnect. Other orientations are possible. In order to achieve the electron movement, the electrodes will overlap the amorphous metal interconnect in some way.

The first and second electrodes can be crystalline metals or other suitable conductors. In one embodiment, the material can be a polysilicon, metals, semiconductor materials, or highly conductive aluminum based materials. These electrodes could be atomically thin, such as graphene layers.

In one embodiment, the first electrode 108 is formed at the same time as the second electrode. This can be by a blanket deposition and then an etch. As such, the first and second electrodes have the same thickness and material properties. In an alternative embodiment, the first electrode 108 is a different conductive material than the second electrode. In this embodiment, the first and second electrodes may be formed in different steps. The first and second electrodes can have different thicknesses, different material properties, and different dimensions that depend on the product in which this transistor is incorporated. If the emitter electrode has different material properties than the base electrode, such as electron work function, then there may not be symmetrical conduction due to the differences. This is acceptable in some end use cases.

At 138, the method includes forming the second insulator 114 on the first and second electrode 108, 110. The second insulator 114 covers all exposed surfaces and is ideally conformal. Opening 116, 118 expose a surface of the first and second electrodes 108, 110 to which electrical connections are made. The second insulator can be any suitable insulator, including an oxide, a nitride, silicon nitride, metal oxides, etc.

At 140, the method includes forming the third electrode 112 on the second insulator 114. The third electrode 112 is formed from a conductive material that also forms the terminals 121 and 122. This conductive material can be conformally deposited and etched to form the third electrode 112 and the terminals 121, 122. The terminals 121, 122 couple to the first and second electrodes and provide a connection to another device, such as another transistor, an LED, or other electronic circuitry.

Subsequent steps can include forming a third insulator 126 on the third electrode 112 and planarizing a surface of the third insulator 126.

Figure 2A:
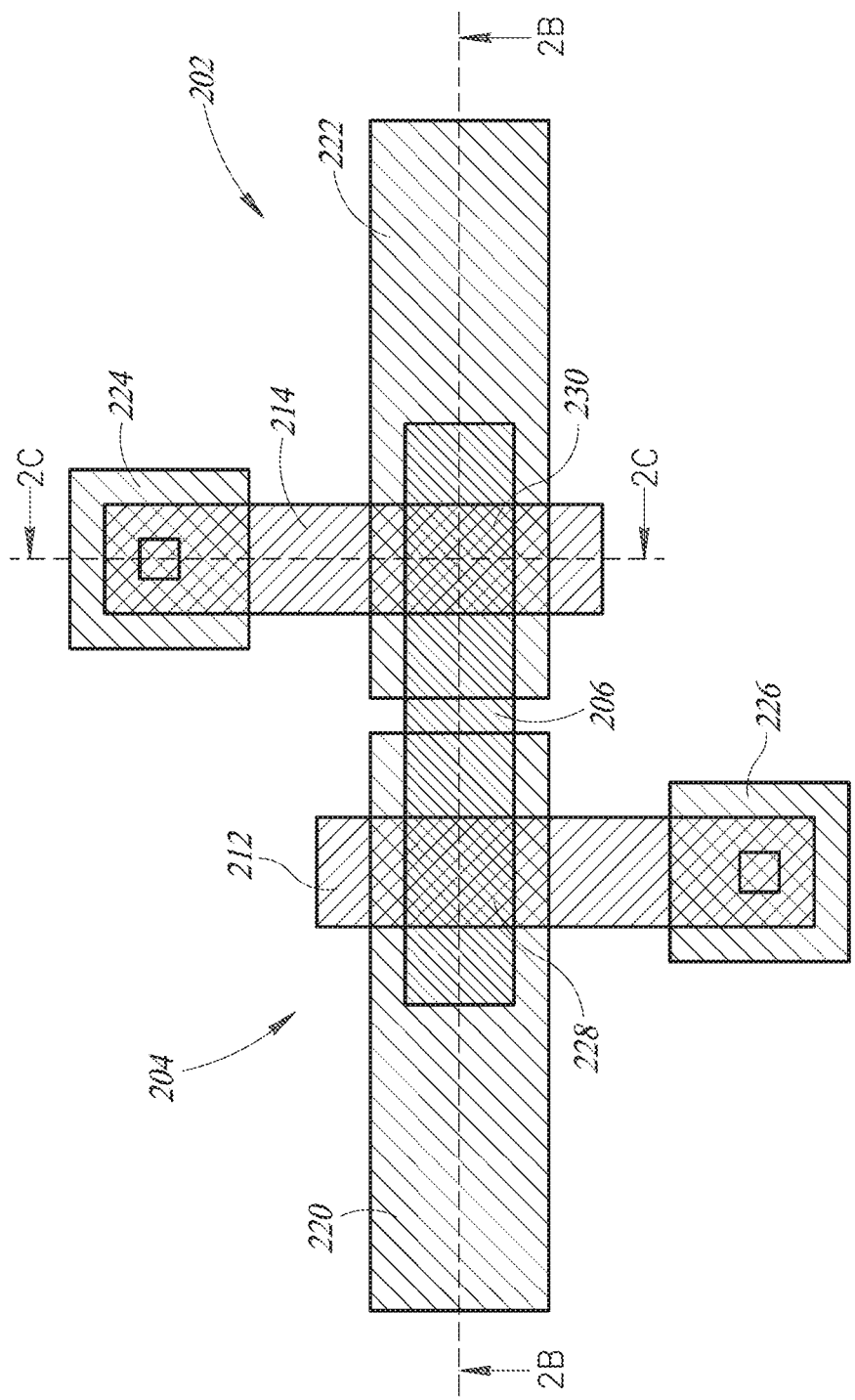

FIGS. 2A, 2B, and 2C are top and cross-sectional views of an alternative embodiment of the present disclosure that includes a first transistor 202 and a second transistor 204 formed from a single amorphous metal layer 206.

The amorphous metal layer 206 is formed on a support substrate 208 that is non-conductive or includes an insulator (not shown) on the substrate to isolate the substrate from the amorphous metal layer. A tunneling oxide layer 210 is formed on the amorphous metal layer 206. A first electrode 212 and a second electrode 214 are formed on and are coplanar on the tunneling oxide, with portions of the first and second electrodes overlapping the amorphous metal layer 206.

A dielectric layer 218 is formed on the first and second electrodes 212, 214. A third electrode 220 and a fourth electrode 222 are formed on the dielectric layer 218. Portions of the third electrode and the fourth electrode overlap and are aligned with the amorphous metal layer and the first and second electrodes, respectively. The third and fourth electrodes are formed from a same material at a same time. Contacts 224 and 226 can also be formed at the same time as the third and fourth electrodes. The contact 224 couples to the second electrode 214 through the dielectric layer and the contact 226 couples to the first electrode 212 through the dielectric layer.

A first active area 228 of overlap of the amorphous metal layer 206, the first electrode 212, and the third electrode 220 forms is where electrons can pass to and from the first electrode 212 and the amorphous metal layer 206. There is a second active area 230 that corresponds to the overlap of the amorphous metal layer 206, the second electrode 214, and the fourth electrode 222. This second active area 230 is where electrons can pass to and from the second electrode 214 and the amorphous metal layer 206.

The first electrode 212 and the second electrodes 214 correspond to an emitter and a base, respectively. The third and fourth electrodes 220, 222 are collector electrodes. These two collector electrodes form two transistors with a shared base-emitter structure. This two transistor structure can be formed by the same method as the transistor structure 100, which the difference being simply leaving more of the conductive layer when forming the third electrode.

Figure 3A:
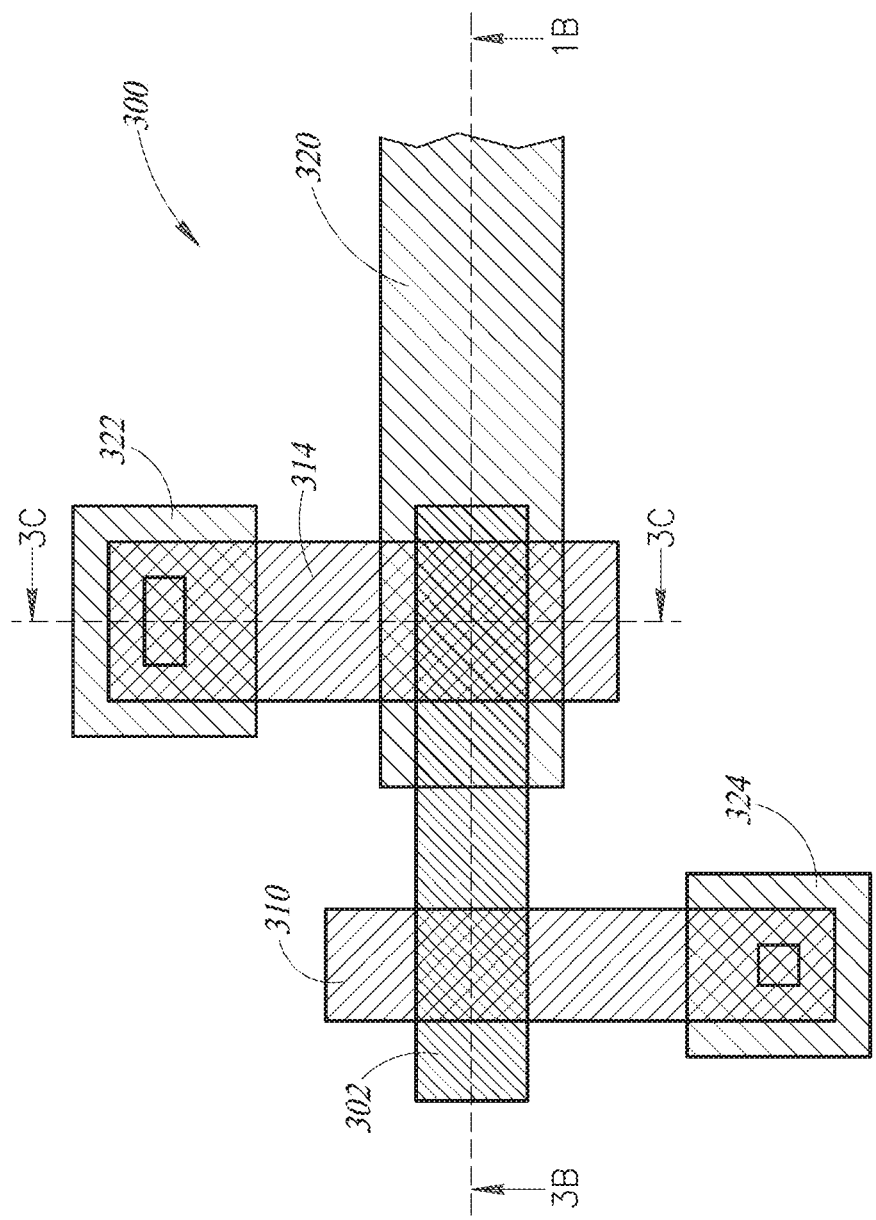
FIGS. 3A-3C are top and cross-sectional views of an amorphous metal thin film transistor structure according to another embodiment of the present disclosure.
Figure 3B:
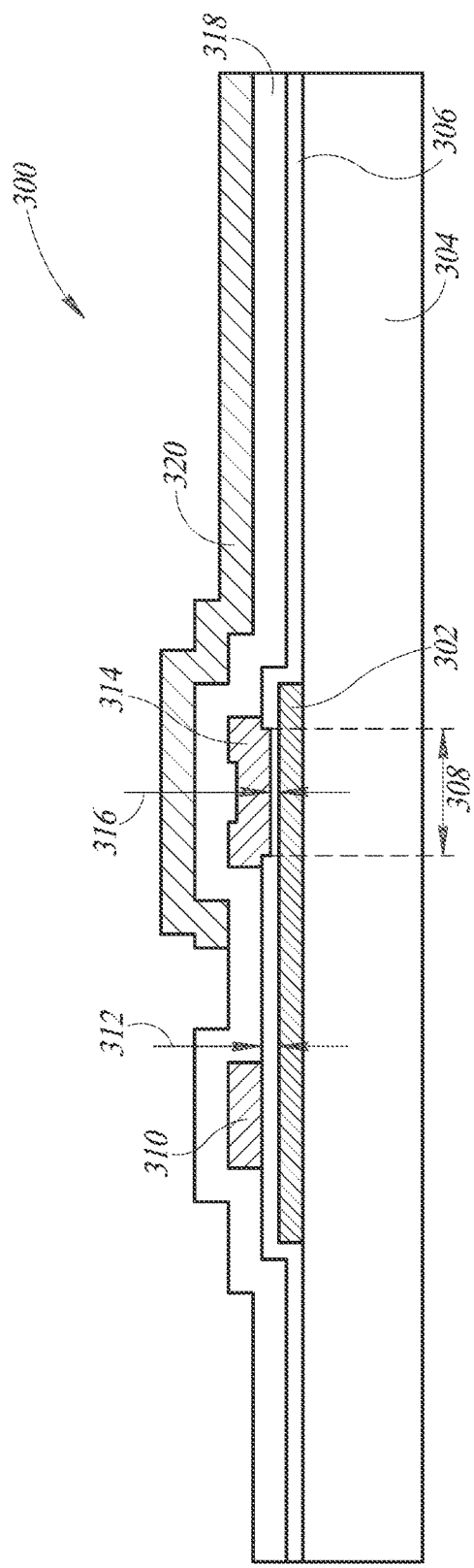
Figure 3C:
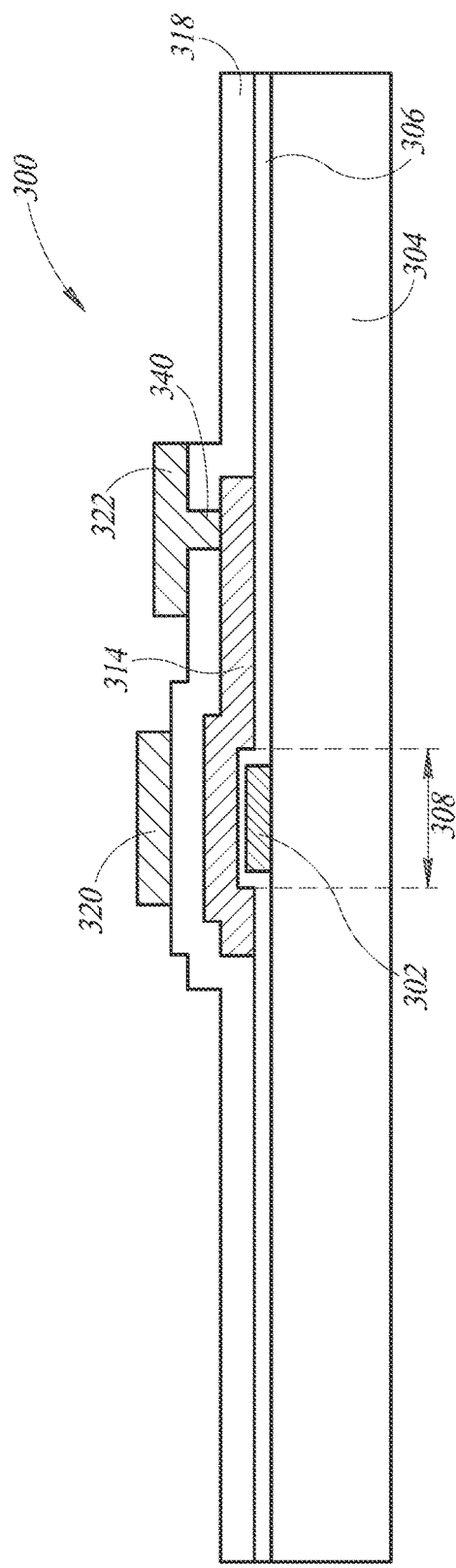

FIGS. 3A, 3B, and 3C are top and cross-sectional views of a transistor structure 300 according to another embodiment of the present disclosure. The transistor structure 300 includes an amorphous metal film 302 formed on a substrate 304. A tunneling insulator 306 is on the amorphous metal film 302.

In one area 308, the tunneling insulator 306 is thinned or otherwise patterned to have a different thickness than other areas of the tunneling insulator 306. The operational properties of the transistor structure 300 are tuned by adjusting the thickness of the tunneling insulator. If the tunneling insulator has been selectively thinned in one active area there may not be symmetrical conduction through the emitter-base structure due to the different thicknesses. This is acceptable in some end use cases.

A first electrode 310 is formed to overlap the amorphous metal film 302 and is separated from the amorphous metal film 302 by the tunneling insulator 306 having a first thickness 312. A second electrode 314, which may be the same material as the first electrode and formed in a same processing step or may be a different material formed at a different time, is formed to overlap the amorphous metal film 302. The second electrode 314 is spaced from the first electrode 310 and is generally in a parallel orientation with respect to the first electrode.

The second electrode 314 is separated from the amorphous metal film 302 by the tunneling insulator 306 having a second thickness 316, which is less than the first thickness. The behavior of the electrons passing to and from the first electrode to the amorphous metal film 302 will be different from the behavior of the electrons to and from the second electrode to the amorphous metal film 302 as a result of the different thicknesses. For example, the patterned tunneling insulator can minimize parasitic capacitance that can form at the areas of overlap of the first and second electrodes with the amorphous metal film. As such, the tunneling insulator can be patterned in the area of overlap of any one of the electrodes as the manufacturing and end product may dictate.

An insulator 318 is formed on the first and second electrodes 310, 314. A third electrode 320 is formed on the first and second electrodes. Formed at the same time as the third electrode 320, contacts 322, 324 are formed to couple to the second electrode and the first electrode, respectively.

Figure 3D:
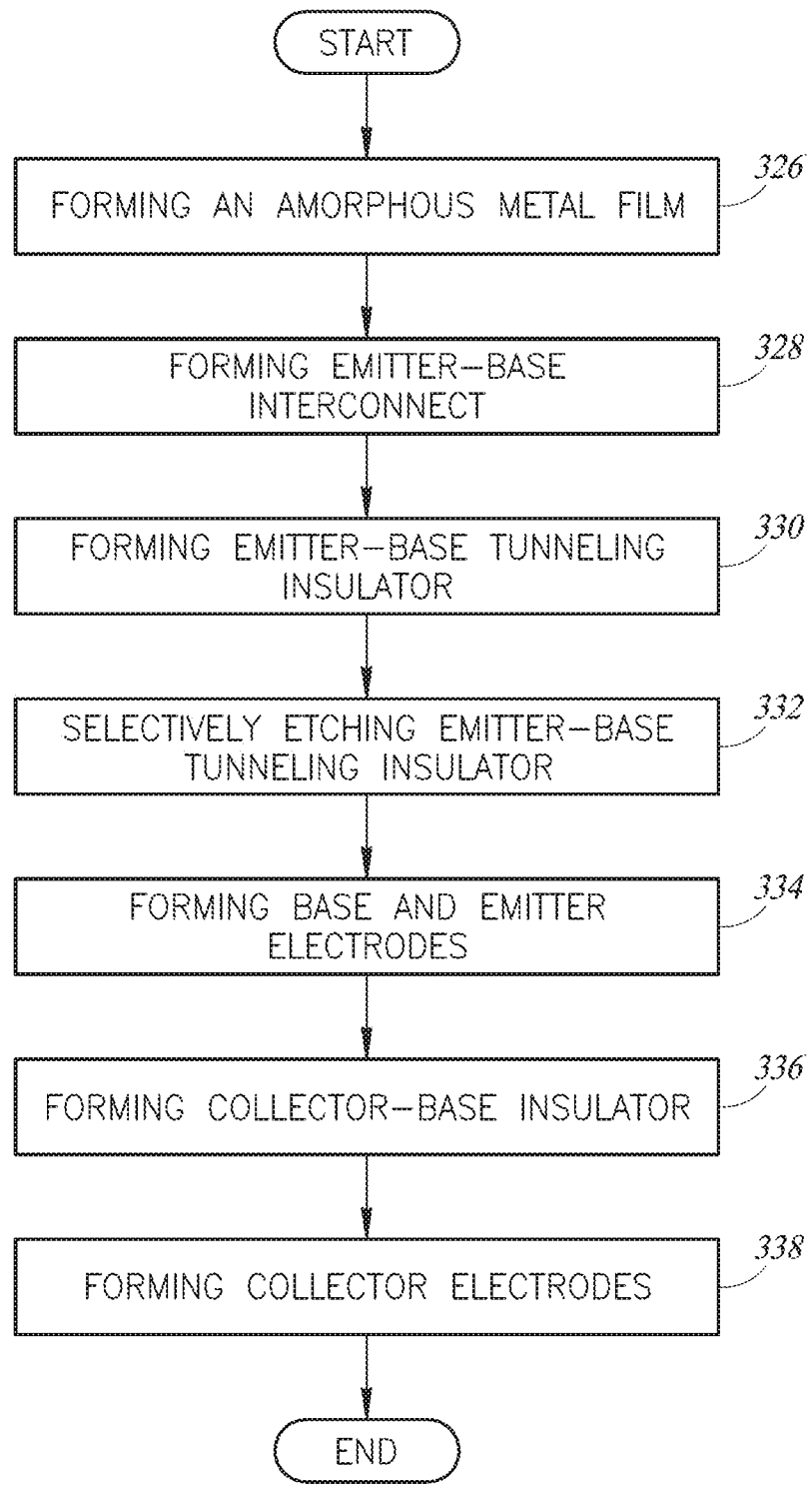
FIG. 3D is a method of forming the amorphous metal thin film transistor structure of FIGS. 3A-3C.

FIG. 3D is an exemplary process flow of making the transistor structure 300 of FIGS. 3A-3C. At step 326, the process includes forming an amorphous metal film on the substrate 304. At step 328, the process includes forming an emitter-base interconnect from the amorphous metal film. This emitter-base interconnect is the amorphous metal film 302. This forming can be achieved by etching away excess portions of the amorphous metal film to form a specific shape for the amorphous metal film 302.

At step 330, the process includes forming an emitter-base tunneling insulator on the amorphous metal film 302. The tunneling insulator 306 completely covers the amorphous metal film 302. In this embodiment, the tunneling insulator 306 is a conformal layer. In other embodiments, the tunneling insulator may be formed in a different manner, such as only covering a top surface of the amorphous metal film 302 or only covering a portion of the top surface of the amorphous metal film 302 that is associated with the area of overlap of the first and second electrodes.

At step 332, the process includes selectively etching the emitter-base tunneling insulator forming the second thickness 316 associated with the second electrode, i.e., the base electrode. At step 334, the process includes forming base and emitter electrodes, i.e., the first and second electrodes. This can be achieved by a deposition and etching to form the shapes of the first and second electrodes.

At 336, the process includes forming a collector-base insulator on the first and second electrodes. Openings, such as opening 340 are formed in the collector-base insulator (insulator 318) to provide access to the first and second electrodes.

At 338, the process includes forming a collector electrode and other contacts, such as the third electrode 320 and the contact 322.

Figure 4A:
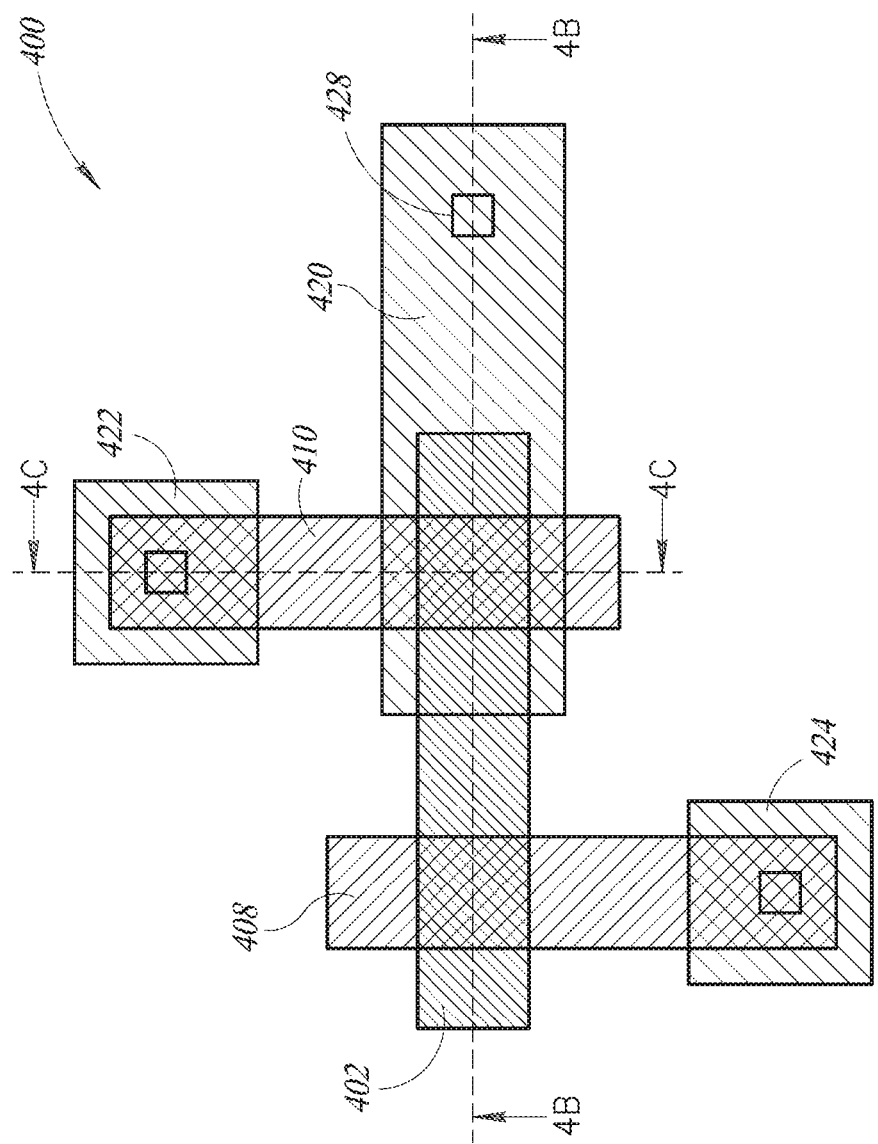

FIGS. 4A, 4B, and 4C are an alternative embodiment of the present disclosure directed to a transistor structure 400 having base and emitter electrodes of different dimensions. The transistor structure includes an amorphous metal interconnect 402 on a planar substrate 404. The amorphous metal interconnect 402 is rectangular from the top down perspective and has a longest dimension that extends in a first direction, along the cross-section line 4B-4B.

A tunneling insulator 406 is on the interconnect 402. An emitter electrode 408 is on the tunneling insulator 406. A base electrode 410 is also on the tunneling insulator 406, spaced from the emitter electrode. Both the emitter and base electrodes are at least partially on top of and overlap the interconnect 402.

The base electrode includes at least a portion 412 that is over and aligned with the interconnect 402 that has a first dimension 414 that is smaller than a second dimension 416 of the emitter electrode 408. Having different dimensions changes the operational properties of the transistor giving the manufacturer the opportunity to tune the transistor structure. For example, a gain of the transistor structure can be increased by making the base electrode more thin. The base electrode and the emitter electrode may be the same material or may be different materials.

The base electrode maybe formed to have a first thickness and then thinned as shown, such that a first portion of the base electrode is the first thickness and a second portion of the base electrode is a second thickness that is less than the first thickness. Alternatively, the base electrode can be formed in a different processing step from the emitter electrode and formed to be thinner than the emitter electrode. Instead of removing portions of the base electrode once formed, the base electrode can be formed as a thinner layer than the emitter electrode.

A first dielectric layer 418 is formed on the base and emitter electrodes. A collector electrode 420 is formed on the first dielectric layer 418. A contact 422 to the base electrode can be formed at the same time and from the same material as the collector electrode. An opening through the first dielectric layer is formed to allow contact to the base electrode. Another contact 424 can be formed to the emitter electrode in a similar manner.

A second dielectric layer 426 may be formed on the collector electrode and contacts 422, 424. In some embodiments, a contact 428 is formed through the second dielectric layer 426 to couple the collector terminal to another device.

Figure 5A:
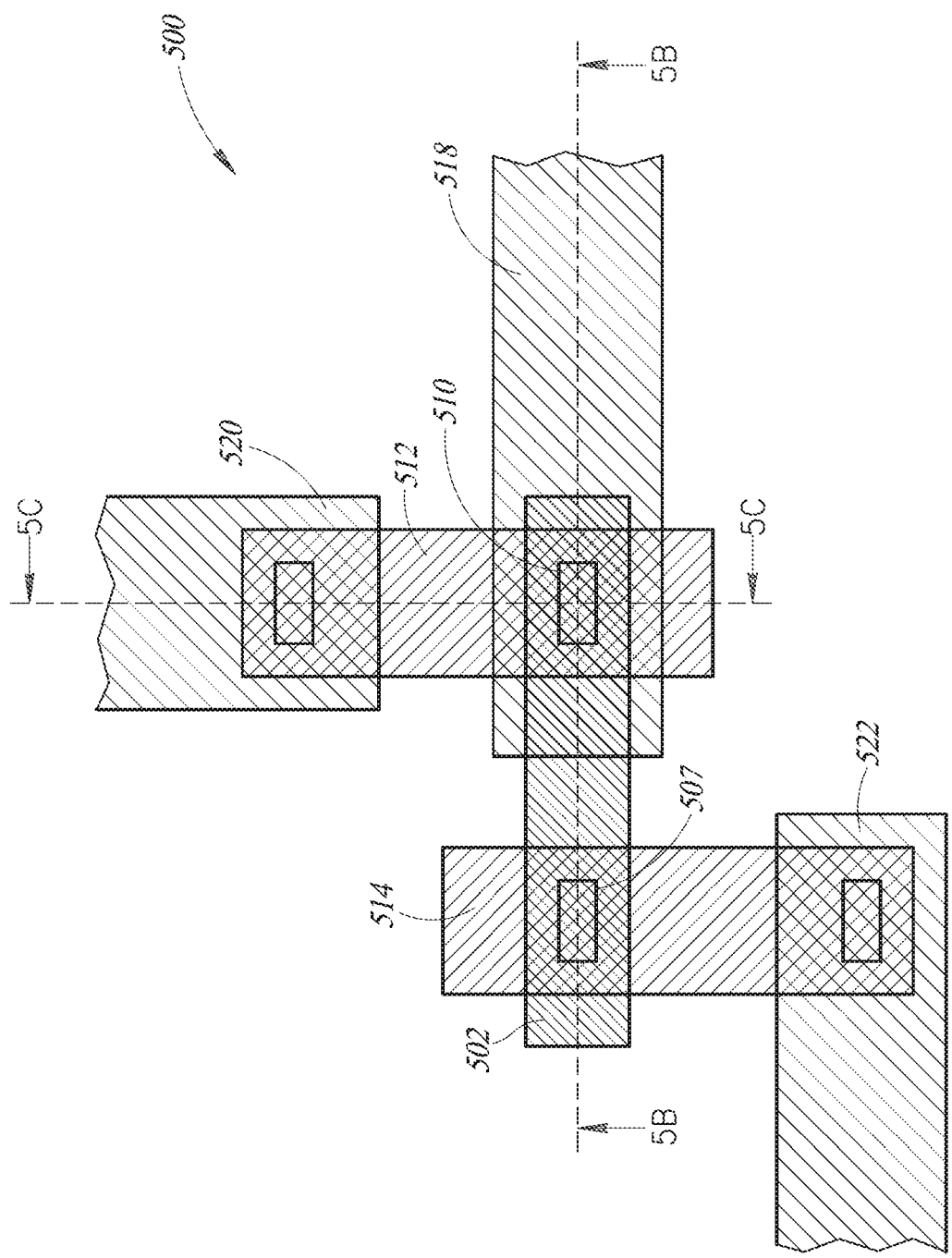
FIGS. 5A-5C are top and cross-sectional views of an amorphous metal thin film transistor structure according to another embodiment of the present disclosure.
Figure 5B:
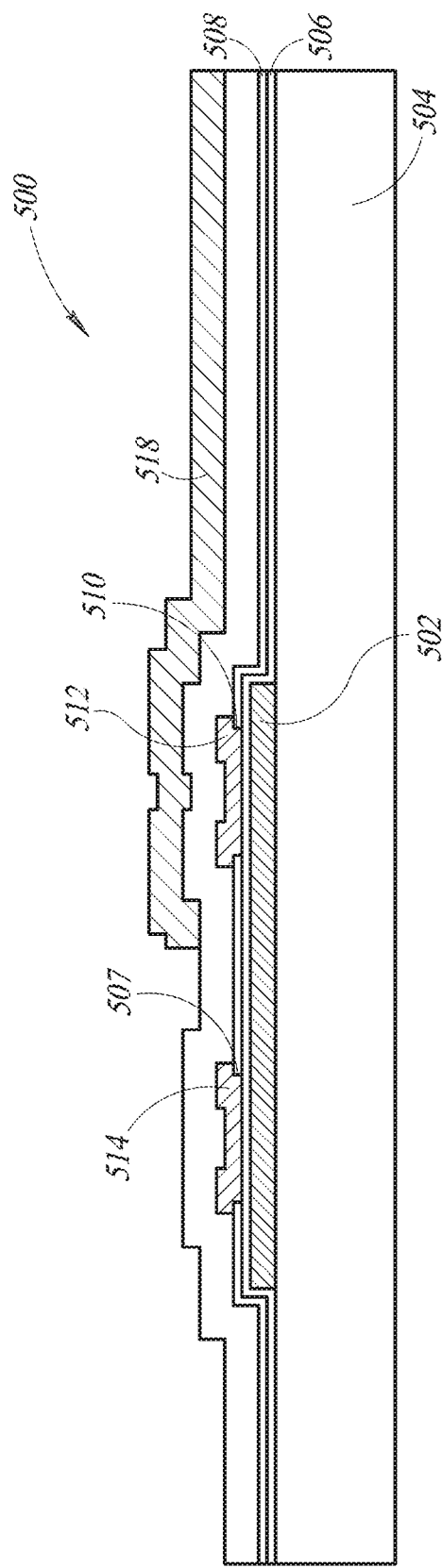
Figure 5C:
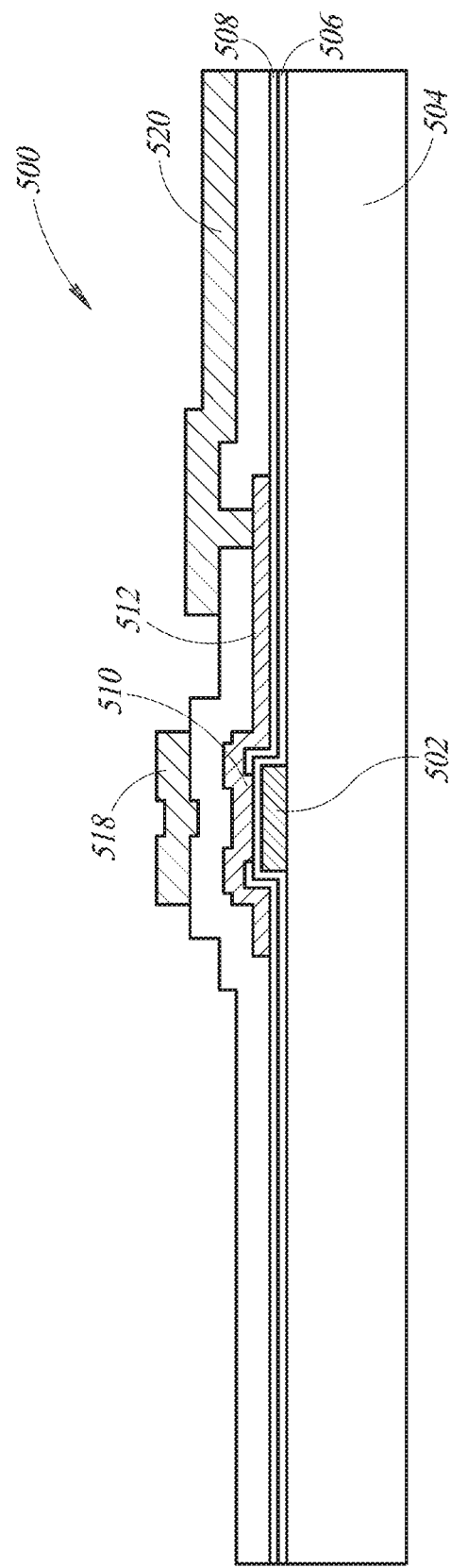

FIGS. 5A, 5B, and 5C are top and cross-sectional views of a transistor structure 500 formed in accordance with another embodiment of the present disclosure. This transistor structure 500 includes an amorphous metal layer 502 formed on a substrate 504. A tunneling oxide layer 506 is formed on the amorphous metal layer 502. A barrier layer 508 is formed on the tunneling oxide layer 506. The barrier layer 508 can be an inorganic material, such as a metal oxide or an organic material, such as a polymer, or any suitable material. The barrier layer 508 can minimize parasitic capacitance that can occur due to the amorphous metal and electrode overlaps.

A first opening 510 is formed in the barrier layer 508. A first electrode 512 is formed in the first opening 510. The first electrode overlaps the amorphous metal layer 502. A second opening 507 is formed in the barrier layer 508 overlapping a portion of the amorphous metal layer 502. A second electrode 514 is formed to overlap the amorphous metal layer 502 and a portion of the second electrode is in the second opening 507.

A dielectric layer 516 is formed on the first and second electrodes 512, 514. A third electrode 518 is formed on the dielectric layer. In this embodiment and in other described in this disclosure, none of the layers are planarized. In other embodiments, each layer or ones of the layers can be planarized as the end product may dictate.

A fourth electrode 520 and a fifth electrode 522 couple to the first electrode 512 and the second electrode 514, respectively. The fourth and fifth electrodes 520, 522 can be formed at the same time, from the same material as the third electrode 518.

The first and second electrodes of this embodiment or any embodiment of the present disclosure may be formed of ultra-thin, 2-D conductors, such as graphene, $MoS_2$, $W_2$, $Ti_3C_2$, GaN, BN, $Ca_2N$, or other suitable materials. The different materials can be selected to adjust the gain of the transistor structure. In some embodiments, the first electrode is a atomically thin layer of conductive material and the second electrode is a significantly thicker layer of conductive material. The conductive materials for these layers may be different types of conductors.

Figure 6:
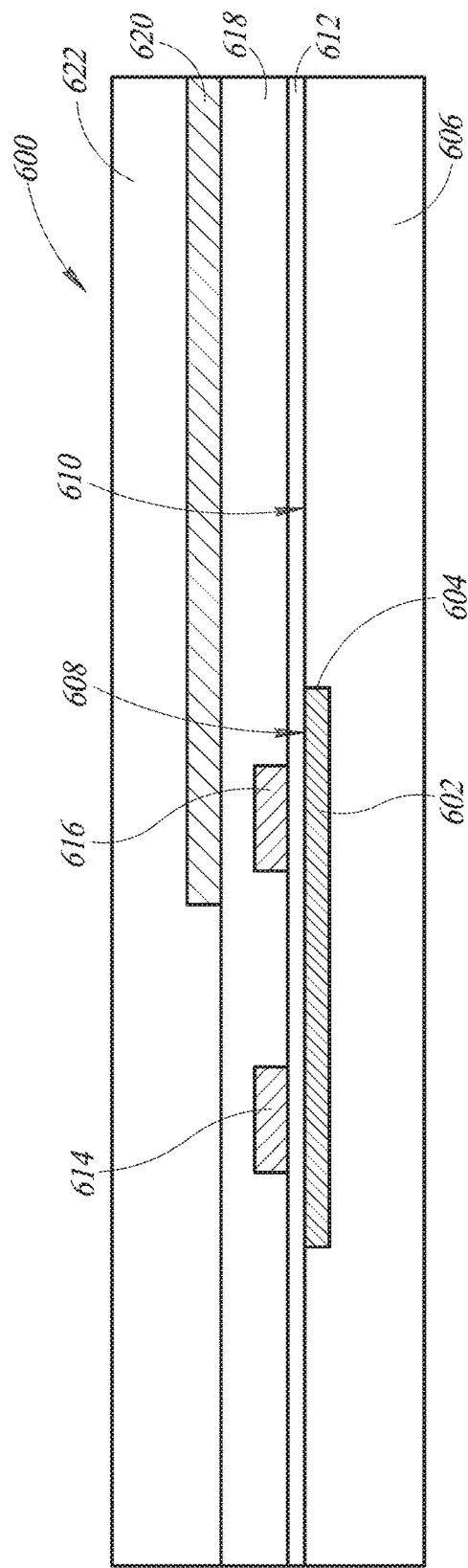
FIG. 6 is a cross-sectional view of an alternative embodiment of a transistor structure of the present disclosure.

FIG. 6 is an alternative embodiment of the present disclosure that includes a transistor structure 600 having an amorphous metal layer 602 formed in a recess 604 of a substrate 606. A first surface 608 of the amorphous metal layer 602 is coplanar with a first surface 610 of the substrate 606.

A tunneling oxide layer 612 is formed on the amorphous metal layer 602 and the first surface of the substrate. First and second electrodes 614, 616 are formed on the tunneling oxide layer 612. The first electrode 614 overlaps a first portion of the amorphous metal layer and the second electrode 616 overlaps a second portion of the amorphous metal layer.

A first dielectric layer 618 is on the first and second electrodes. A third electrode 620 is formed on a planar surface of the first dielectric layer 618. A second dielectric layer 622 is on the third electrode.

Figure 7:
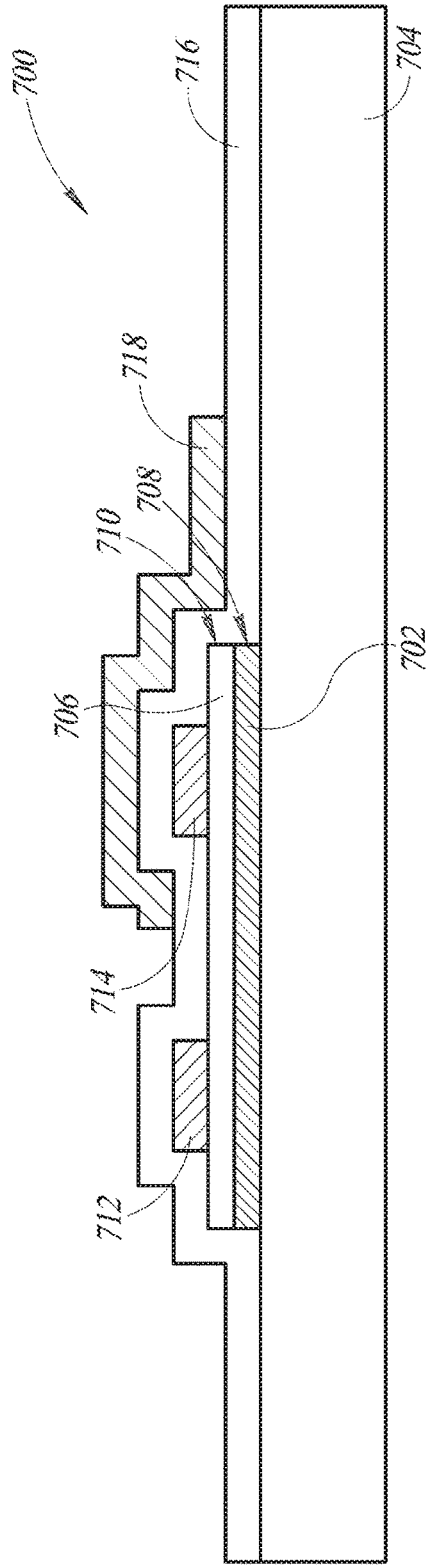
FIG. 7 is a cross-sectional view of an alternative embodiment of a transistor structure of the present disclosure.

FIG. 7 is an alternative embodiment of the present disclosure having a transistor structure 700 with an amorphous metal layer 702 on a planar surface of a substrate 704. A tunneling oxide layer 706 is on the amorphous metal layer 702. Sides 708 of the amorphous metal layer 702 and sides 710 of the tunneling oxide layer 706 are coplanar. This can be achieved by forming an amorphous layer, forming a tunneling oxide layer, and then etching both layers at the same time.

First and second electrodes 712, 714 are formed on the tunneling oxide layer. A dielectric layer 716 is formed on the first and second electrodes. A third electrode 718 is formed on the dielectric layer 716.

Figure 8:
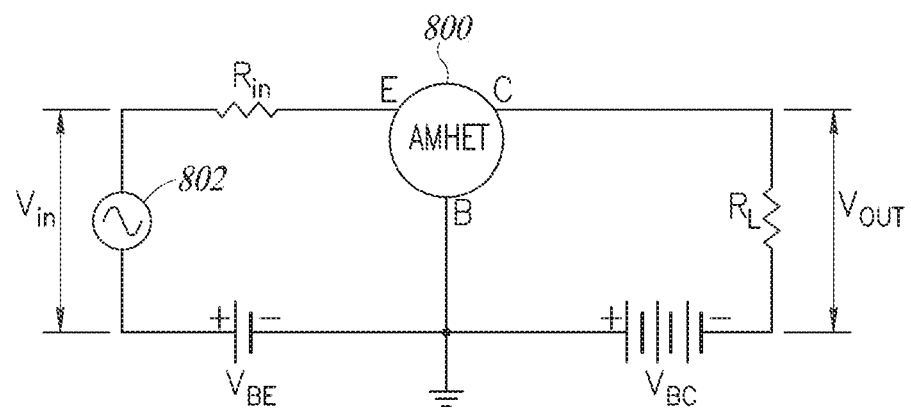
FIGS. 8, 9, and 10 are circuit schematics incorporating transistors of the present disclosure.

FIG. 8 is a common base transistor structure formed in accordance with a transistor structure of the present disclosure. An amorphous hot electron transistor 800 have an emitter E, a base B, and a collector C. The base is coupled to ground. The collector is coupled to a resistor $R_L$, which represents a load and could be another circuit. A voltage supply $V_{BC}$ is coupled between ground and the resistor $R_L$. A voltage supply $V_{BE}$ is coupled between ground and the resistor $R_{in}$. A current supply 802 is coupled between the voltage supply $V_{BE}$ and the resistor $R_{in}$. The resistor $R_{in}$ is coupled to the emitter E.

Figure 9:
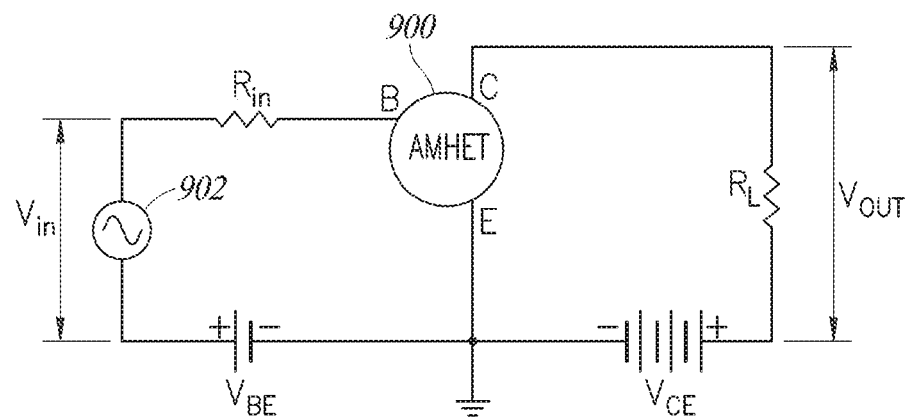

FIG. 9 is a common emitter transistor 900 formed in accordance with a transistor structure of the present disclosure. The transistor 900 is an amorphous hot electron transistor having an emitter E, a base B, and a collector C. The emitter is coupled to ground. The collector is coupled to a resistor $R_L$, which represents a load and could be another circuit. A voltage supply $V_{CE}$ is coupled between ground and the resistor $R_L$. A voltage supply $V_{BE}$ is coupled between ground and the resistor $R_{in}$. A current supply 902 is coupled between the voltage supply $V_{BE}$ and the resistor $R_{in}$. The resistor $R_{in}$ is coupled to the base B.

Figure 10:
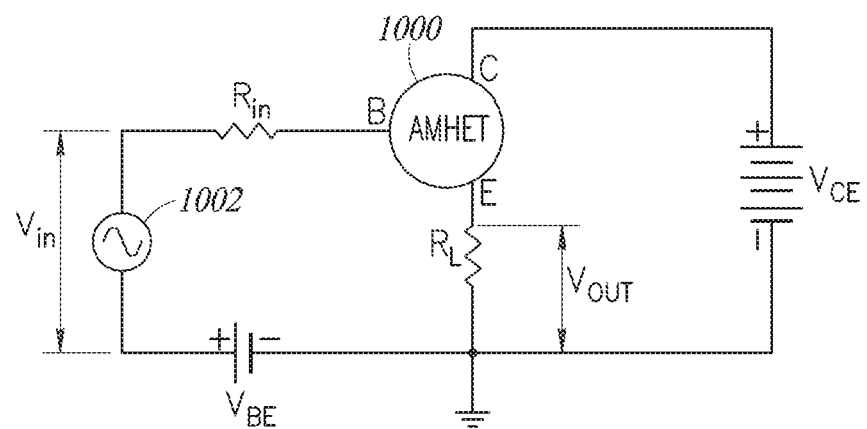

FIG. 10 is a common collector transistor 1000 formed in accordance with a transistor structure of the present disclosure. The transistor 1000 is an amorphous hot electron transistor having an emitter E, a base B, and a collector C. The emitter E is coupled to ground through resistor $R_L$, which represents a load and could be another circuit. A voltage supply $V_{CE}$ is coupled between ground and the collector C. A voltage supply $V_{BE}$ is coupled between ground and the resistor $R_{in}$. A current supply 1002 is coupled between the voltage supply $V_{BE}$ and the resistor $R_{in}$. The resistor $R_{in}$ is coupled to the base B.

Figure 11A:
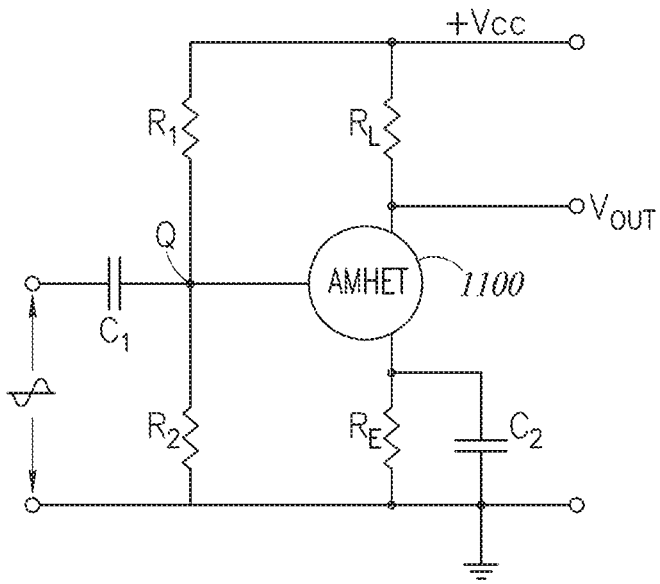
FIGS. 11A and 11B are a single stage common emitter amplifier circuit and a related signal representation.
Figure 11B:
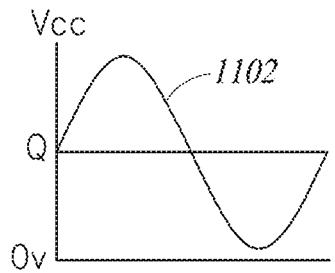

FIGS. 11A and 11B are a single stage common emitter amplifier circuit and a related signal representation. This is a representation of incorporating an AMHET into common circuits, such as amplifiers. In FIG. 11B, a DC bias voltage Q is illustrated. This bias voltage Q is applied to a junction where a first resistor $R_{in}$, a second resistor $R_2$, and a first capacitor $C_1$ are coupled together and coupled to the AMHET1100. There is a voltage in $V_{in}$, applied between ground and a plate of the first capacitor $C_1$. A voltage $V_{CC}$ is coupled to the first resistor $R_1$ and a load resistor $R_L$. A second capacitor $C_2$ is coupled between a third resistor $R_E$ and ground. An output signal $V_{OUT}$, is an amplified signal illustrated in FIG. 11B.

Figure 12:
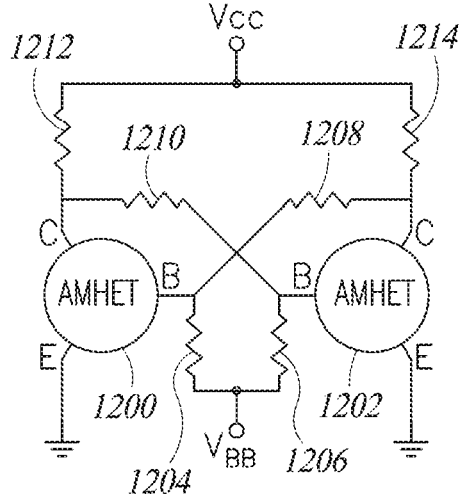
FIGS. 12 and 13 are circuit schematics incorporating transistors of the present disclosure.
Figure 13:
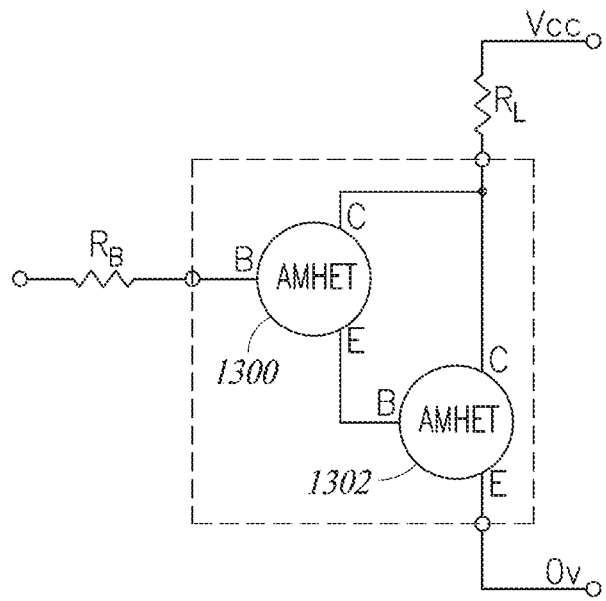

FIGS. 12 and 13 are circuit schematics incorporating multiple transistors of the present disclosure. FIG. 12 includes a first AMHET (amorphous metal hot electron transistor) 1200 and a second AMHET 1202 in a flip-flop arrangement. Each of the emitters E of the first and second AMHETs are coupled to ground. Each of the bases B are coupled to first resistors 1204, 1206. Each of the first resistors are also coupled to the voltage supply $V_{BB}$. The base B of the first AMHET 1200 is coupled to a second resistor 1208. The second resistor 1208 is coupled to the collector C of the second AMHET 1202 through a third resistor 1210. The base B of the second AMHET 1202 is coupled to the collector C of the first AMHET 1200. A fourth resistor 1212 is coupled between the collector C of the first AMHET and a voltage supply $V_{CC}$. A fifth resistor 1214 is coupled between the collector of the second AMHET and the voltage supply $V_{CC}$.

This AMHET flip flop structure can be integrated into various switching applications, such as counters, shift registers, clock pulse generators, or other circuits. These can be integrated in memory circuits, relay control functions, or other functions, such as in radar applications or communication systems. Capacitive components can be included to shape signals for the end application.

FIG. 13 is an alternative embodiment of a circuit structure including a first AMHET 1300 and a second AMHET 1302. An emitter E of the first AMHET is coupled to a base B of the second AMHET. Collectors of the first and second AMHET are coupled together. A base of the first AMHET 1300 is coupled to a resistor $R_B$, which represents a load or another circuit. The collectors C are coupled to a resistor $R_L$, which represent a load or another circuit. The resistor $R_L$ is coupled to a voltage $V_{CC}$. An emitter E of the second AMHET 1302 is coupled to ground.

Figure 14:
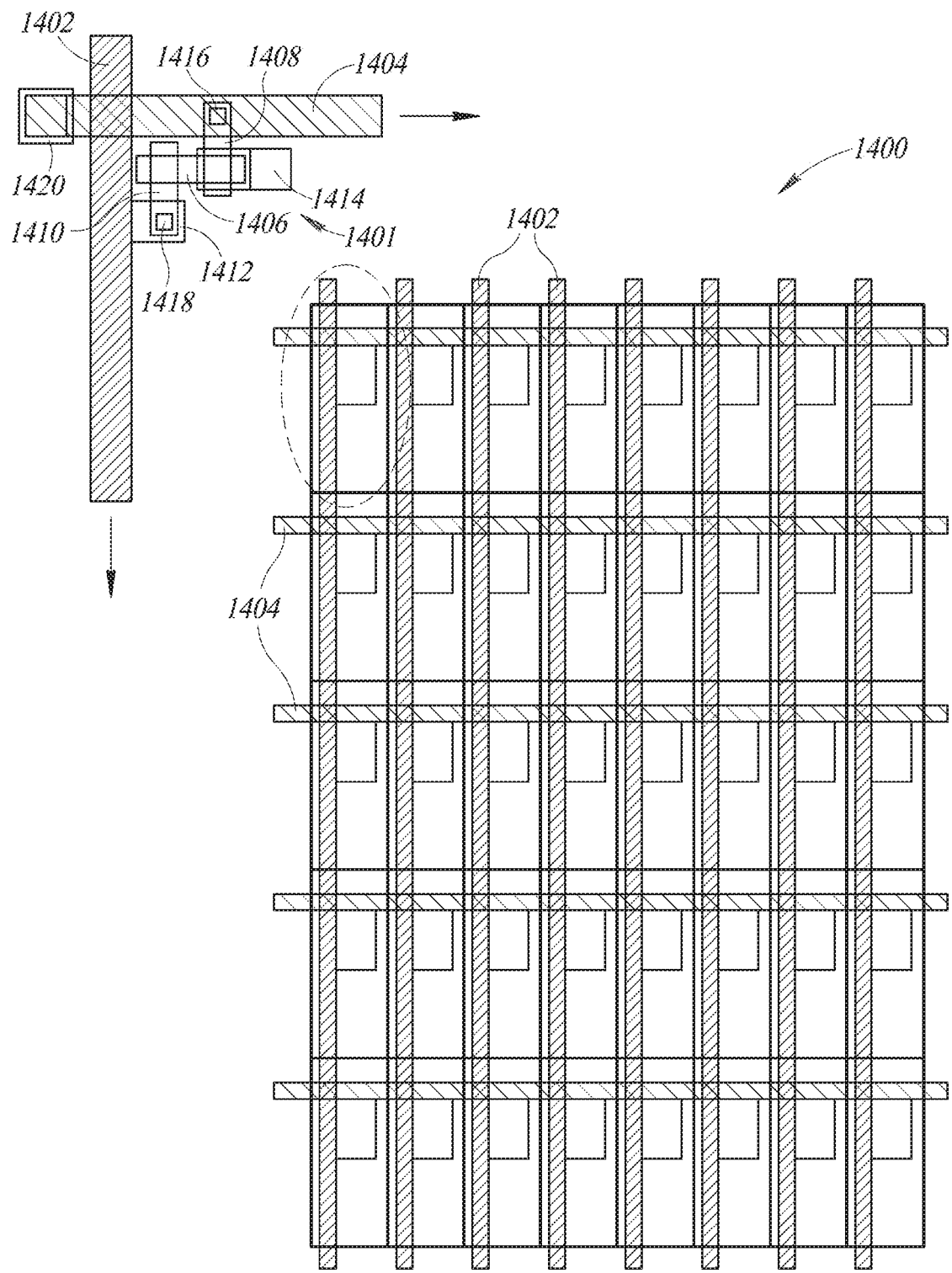
FIG. 14 is a transistor structure of the present disclosure in an array for a display.

FIG. 14 is a transistor structure of the present disclosure in an array. The array can be incorporated into a display or may be integrated with sensors, such as in an x-ray detector. The array 1400 includes a plurality of rows 1404 and a plurality of columns 1402. Each row can conduct a base signal to AMHET transistors 1401 of the array. Each column can conduct emitter signals to the AMHET transistors 1401. The AMHET transistor 1401 includes an amorphous metal layer 1406. An emitter electrode 1410 overlaps the amorphous metal layer 1406 and couples to the column 1402. A base electrode 1408 overlaps the amorphous metal layer 1408 and couples to the row 1404. A collector electrode and contact 1414 overlap the amorphous metal layer 1406 and the base electrode 1408. The collector electrode 1414 is coupled to other pixel or cell control elements. The collector electrode 1414 may be coupled to a capacitor or other transistor.

This AMHET transistor 1401 could be operated as a matrix switch in common base, common emitter, or common collector modes. This particular illustration is a common emitter configuration. Such a matrix switch allows for a single element to be controlled.

Figure 15:
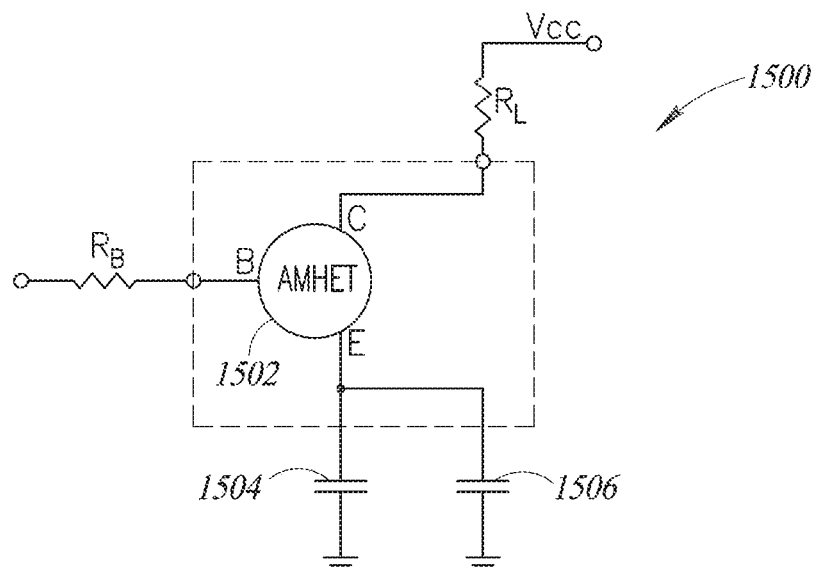
FIG. 15 is an liquid crystal display circuit that includes an AMHET.

A plurality of AMHET transistors 1401 can be incorporated into a variety of active matrix display technologies, such as liquid crystal displays, organic light emitting diode displays, electrophoretic, electroluminescent, etc. Each specific active matrix application will have additional circuit elements to form the display. Some of the elements, such as resistors, capacitors, diodes, other transistors, or other electronic components can be formed in the same processing steps as the AMHET or in subsequent processing. FIG. 15 is an example of an liquid crystal display circuit 1500 that includes an AMHET 1502. An emitter E of the AMHET 1502 is coupled to a storage capacitor 1504 and a liquid crystal capacitor 1506. Each of the storage capacitor 1504 and the liquid crystal capacitor 1506 are also coupled to ground. A base of the AMHET 1502 is coupled to a resistor $R_B$. A collector of the AMHET 1502 is coupled to a resistor $R_L$.

Figure 16:
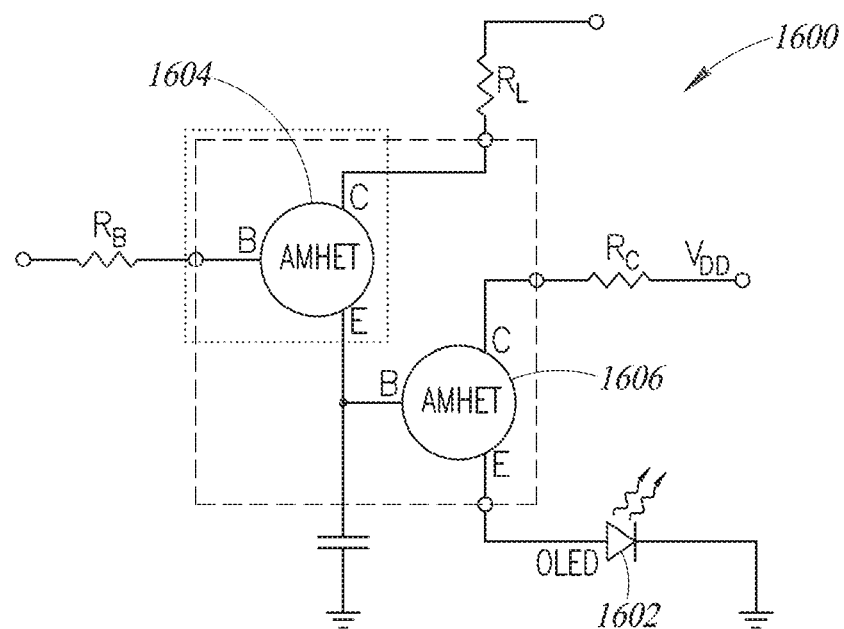
FIG. 16 is an organic light emitting diode circuit that includes an AMHET.

FIG. 16 is a circuit 1600 to drive an organic light emitting diode (OLED) 1602 that includes a first AMHET 1604 and a second AMHET 1606. An emitter E of the first AMHET is coupled to a base of the second AMHET. A storage capacitor is coupled between the base of the second AMHET and ground. An emitter of the second AMHET is coupled to the OLED.

The various embodiments described above can be combined to provide further embodiments. U.S. Provisional Application 62/359,596, filed Jul. 7, 2016 is incorporated herein by reference, in its entirety.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a non-conducting substrate;
an amorphous metal layer on the non-conducting substrate;
a tunneling dielectric layer on the amorphous metal layer;
a first electrode and a second electrode on the tunneling dielectric layer, each overlapping the amorphous metal layer;
a second dielectric layer on the first and second electrodes; and
a third electrode on the second dielectric layer, the third electrode overlapping the second electrode and the amorphous metal layer, the first and second electrodes being between the third electrode and the amorphous metal layer.

2. The device of claim 1 wherein the first and second electrodes are a crystalline metal on the tunneling dielectric layer.

3. The device of claim 1 wherein the first electrode is a first conductive material and the second electrode is a second conductive material that is different from the first conductive material.

4. The device of claim 1 wherein the first electrode and the second electrode are the same conductive material.

5. The device of claim 1 wherein the tunneling dielectric layer includes a metal oxide or a metal nitride.

6. The device of claim 1 wherein the first electrode has a first thickness and the second electrode has a second thickness that is different from the first thickness.

7. The device of claim 1 wherein the tunneling dielectric layer includes a recess and the second electrode is in the recess.

8. The device of claim 7 wherein the recess overlaps and is aligned with the amorphous metal layer.

9. The device of claim 1 wherein the amorphous metal layer has a longest dimension along a first direction, the first and second electrodes have a longest dimension along a second direction that is transverse to the first direction.

10. The device of claim 1, further comprising a first terminal coupled to the first electrode and a second terminal coupled to the second electrode.

11. The device of claim 10 wherein the first terminal couples to the first electrode through the second dielectric layer and the second terminal couples to the second electrode through the second dielectric layer.

12. A device, comprising:
a substrate;
an amorphous metal layer on the substrate, the amorphous metal layer having a length extending along a first direction and a width extending along a second direction that is transverse to the first direction;
a tunneling oxide layer on the amorphous metal layer;
an emitter electrode on the tunneling oxide layer, the emitter electrode overlapping a first portion of the amorphous metal layer, the emitter electrode having a length extending along the second direction and a width extending along the first direction;
a base electrode on the tunneling oxide layer, the base electrode overlapping a second portion of the amorphous metal layer, the base electrode having a length extending along the second direction and a width extending along the first direction;
an insulator on the emitter electrode and the base electrode; and
a collector electrode on the insulator, the collector electrode overlapping the base electrode and the second portion of the amorphous metal layer.

13. The device of claim 12 wherein the collector electrode has a length extending along the first direction and a width extending along the second direction, the width being smaller than the length.

14. The device of claim 12 wherein the length of the emitter electrode is greater than the width of the emitter electrode and the length of the base electrode is greater than the width of the base electrode.

15. A device, comprising:
a substrate;
an amorphous metal layer on the substrate;
a first insulator on the amorphous metal layer;
a first electrode on the first insulator and overlapping a first portion of the amorphous metal layer;

a second electrode on the first insulator and overlapping a second portion of the amorphous metal layer;
a second insulator;
a first contact through the second insulator and coupled to the first electrode;
a second contact through the second insulator and coupled to the second electrode; and
a third electrode on the second insulator and overlapping the second portion of the amorphous metal layer.

16. The device of claim 15, further comprising:
a fourth electrode on the second insulator and overlapping the first portion of the amorphous metal layer.

17. The device of claim 15 wherein the first electrode is thicker than the second electrode.

18. The device of claim 15, further comprising a third insulator between the first insulator and the first and second electrodes.

19. The device of claim 18, further comprising a first opening in the third insulator at the first portion of the amorphous metal layer and a second opening in the third insulator at the second portion of the amorphous metal layer.

20. A device, comprising:
a non-conducting substrate;
an amorphous metal layer on the non-conducting substrate;
a tunneling dielectric layer on the amorphous metal layer;
a first electrode and a second electrode on the tunneling dielectric layer, each overlapping the amorphous metal layer;
a second dielectric layer on the first and second electrodes; and
a third electrode on the second dielectric layer, the third electrode overlapping the second electrode and the amorphous metal layer,
wherein a thickness of a first portion of the tunneling dielectric layer between the first electrode and the amorphous metal layer is greater than a thickness of a second portion of the tunneling dielectric layer between the second electrode and the amorphous metal layer.

21. The device of claim 20, further comprising a first contact coupled to the first electrode and a second contact coupled to the second electrode.

* * * * *